United States Patent
Ichikawa

(10) Patent No.: US 7,739,563 B2
(45) Date of Patent: *Jun. 15, 2010

(54) SEMICONDUCTOR INTEGRATED CIRCUIT AND MEMORY TEST METHOD

(75) Inventor: Osamu Ichikawa, Osaka (JP)

(73) Assignee: Panasonic Corporation, Osaka (JP)

( * ) Notice: Subject to any disclaimer, the term of this patent is extended or adjusted under 35 U.S.C. 154(b) by 145 days.

This patent is subject to a terminal disclaimer.

(21) Appl. No.: 12/098,987

(22) Filed: Apr. 7, 2008

(65) Prior Publication Data

US 2008/0215946 A1 Sep. 4, 2008

Related U.S. Application Data

(62) Division of application No. 11/142,323, filed on Jun. 2, 2005, now Pat. No. 7,372,251.

(51) Int. Cl.
*G11C 29/00* (2006.01)

(52) U.S. Cl. ............................ 714/718; 714/5; 714/25; 714/30; 714/42; 714/702; 714/719; 714/720; 714/733; 714/734; 714/738; 714/742; 714/743; 365/201

(58) Field of Classification Search ........................ None
See application file for complete search history.

(56) References Cited

U.S. PATENT DOCUMENTS

| | | | |
|---|---|---|---|
| 4,797,886 A | | 1/1989 | Imada |
| 5,453,993 A | * | 9/1995 | Kitaguchi et al. ........... 714/733 |
| 5,646,948 A | | 7/1997 | Kobayashi et al. |
| 5,805,608 A | | 9/1998 | Baeg et al. |
| 5,835,428 A | * | 11/1998 | Kobayashi .................. 365/201 |
| 6,067,262 A | | 5/2000 | Irrinki et al. |
| 6,097,206 A | | 8/2000 | Takano |
| 6,317,851 B1 | | 11/2001 | Kobayashi |
| 6,436,741 B2 | | 8/2002 | Sato et al. |
| 6,651,202 B1 | | 11/2003 | Phan |
| 6,690,189 B2 | | 2/2004 | Mori et al. |
| 6,742,149 B2 | | 5/2004 | Osawa |
| 6,744,272 B2 | | 6/2004 | Ernst et al. |
| 6,769,081 B1 | | 7/2004 | Parulkar |
| 2001/0040829 A1 | * | 11/2001 | Arimoto et al. ........ 365/189.02 |
| 2002/0073363 A1 | * | 6/2002 | Abrosimov et al. ........... 714/42 |
| 2002/0194546 A1 | * | 12/2002 | Ooishi ........................ 714/42 |
| 2003/0218928 A1 | * | 11/2003 | Tanizaki et al. ............. 365/201 |
| 2003/0233604 A1 | * | 12/2003 | Lin et al. ..................... 714/718 |

* cited by examiner

*Primary Examiner*—John P Trimmings
(74) *Attorney, Agent, or Firm*—Dickinson Wright PLLC

(57) ABSTRACT

A semiconductor integrated circuit is configured to test a high-speed memory at the actual operation speed of the memory, even when the operation speed of the built-in self-test circuit of the integrated circuit is restricted. In order to test a memory operating on a first clock, the integrated circuit is provided with a first test pattern generation section, operating on a second clock, for generating test data, and a second test pattern generation section, operating on a third clock, the inverted clock of the second clock, for generating test data. Furthermore, the integrated circuit is provided with a test data selection section for selectively outputting either the test data output from the first test pattern generation section or the test data output from the second test pattern generation section depending on the signal value of the second clock, thereby inputting the test data to the memory as test data. The frequency of the second clock is lower than, for example, one half the frequency of the first clock.

12 Claims, 27 Drawing Sheets

SEMICONDUCTOR INTEGRATED CIRCUIT AND MEMORY TEST METHOD

This is a division of application Ser. No. 11/142,323 filed Jun. 2, 2005, which is a division of application Ser. No. 10/647,506 filed Aug. 26, 2003 (U.S. Pat. No. 6,917,215), of which continuation-in-part application Ser. No. 11/166,345 was filed Jun. 27, 2005 (U.S. Pat. No. 7,295,028), all of which claim priority based on JP 2002-254181 filed Aug. 30, 2002; the entire contents of Ser. Nos. 11/142,323, 10/647,506 and JP 2002-254181 are incorporated by reference herein.

BACKGROUND OF THE INVENTION

1. Field of the Invention

The present invention relates to a semiconductor integrated circuit capable of testing a memory by carrying out a built-in self-test, and more particularly to a semiconductor integrated circuit capable of testing a memory operating at high speed. The present invention also relates to a memory test method.

2. Prior Art

In recent years, as the LSI technology progresses, the operation speeds of memories included in semiconductor integrated circuits have become increasing. In order to test these memories, a built-in self-test (the so-called BIST) is generally used.

FIG. 21 shows a circuit block for carrying out a BIST. In FIG. 21, numeral 401 designates a BIST circuit, and numeral 402 designates a memory to be subjected to a BIST. A first clock (memory clock) is input to the memory 402, and a second clock (BIST clock) is input to the BIST circuit 401. The memory 402 is classified into an ordinary data rate memory operating in synchronization with the rising edge or the falling edge of a clock and a double data rate memory operating in synchronization with both the rising and falling edges of the clock.

From the BIST circuit 401 to the memory 402, addresses and data are input, and control signals, such as a write enable signal, are also input. In addition, the output (Data-Out) of the memory 402 is input to the BIST circuit 401 and an ordinary logic circuit. Furthermore, an expected value comparison circuit inside the BIST circuit 401 compares the data input from the memory 402 with an expected value, thereby carrying out a pass/fail judgment.

FIG. 22 shows clock timing at the time when a BIST is carried out for the memory 402 in the case when the memory 402 is a double data rate (DDR: Double Data Rate) memory. In addition, FIG. 22 shows the first clock (Memory Clock), the second clock (BIST Clock) and the data output (Data-Out) of the memory 402.

The memory 402, a DDR memory, can operate in synchronization with both the rising and falling edges of the first clock (Memory Clock). Hence, in the case when a read operation is carried out, for example, data is output at the rising edge of the first clock (Memory Clock) at time t1 of FIG. 22, and the next data is output at the falling edge of the first clock (Memory Clock) at time t2.

In the BIST circuit 401 for testing this kind of memory 402, by setting the rising edges of the second clock (BIST Clock) at times t1, t2, . . . , tn, the DDR memory can be tested at its actual operation speed.

In the BIST circuit 401 for testing the high-speed memory 402, it is necessary to increase the operation speed of the BIST circuit 401 itself depending on the operation speed of the memory 402.

In the case when a memory operates at the double speed of the clock frequency, just like the above-mentioned DDR memory, or in the case when a memory that operates at very high speed is tested at its actual operation speed, the BIST circuit itself is required to be operated at the high speed. However, since the operation frequency of the memory is very high, it is difficult to attain a BIST circuit capable of operating at such a high operation frequency, thereby causing a problem of attaining such a BIST circuit.

In addition, cells having high drive capability are required for high-speed operation, thereby causing a problem of increasing the area of the BIST circuit. Furthermore, the clock frequency of the BIST circuit is required to be raised for high-speed operation, thereby causing a problem of increasing the power consumption of the BIST circuit.

SUMMARY OF THE INVENTION

The present invention is intended to solve the above-mentioned problems. An object of the present invention is to provide a semiconductor integrated circuit capable of testing a high-speed memory at the actual operation speed of the memory, even when the operation speed of the BIST circuit of the semiconductor integrated circuit is restricted.

In addition, another object of the present invention is to provide a memory test method capable of testing a high-speed memory at its actual operation speed, even when the operation speed of the BIST circuit is restricted.

A semiconductor integrated circuit in accordance with a first invention comprises a memory operating on a first clock, a first test pattern generation section, operating on a second clock having half the frequency of the first clock, for generating first test data, a second test pattern generation section, operating on a third clock, the inverted clock of the second clock, for generating second test data, and a test data selection section for selectively outputting either the first or second test data being output from the first test pattern generation section or the second test pattern generation section, respectively, depending on either the signal value of the second clock or the signal value of the third clock, thereby inputting the selected test data to the memory as third test data.

With this configuration, the first test pattern generation section generates the first test data depending on the second clock having half the frequency of the first clock supplied to the memory. In addition, the second test pattern generation section generates the second test data depending on the third clock, the inverted clock of the second clock. Furthermore, the test data selection section selects either the first or second test data depending on either the signal value of the second clock or the signal value of the third clock and inputs the selected test data to the memory as the third test data. Hence, even when the operation speed of the first and second test pattern generation sections and the test data selection section is restricted to half the operation speed of the memory, the memory can be tested at its actual operation speed. Since the test can be carried out even when the operation speed of the first and second test pattern generation sections and the test data selection section is low, the drive capability of the integrated circuit can be small, whereby the area of the circuit can be small and the power consumption of the circuit can be reduced.

A semiconductor integrated circuit in accordance with a second invention comprises a memory operating on a first clock, a first test pattern generation section, operating on a second clock having half the frequency of the first clock, for generating first test data, a second test pattern generation section, operating on the second clock, for generating second test data, and a test data selection section for selectively outputting either the first or second test data being output from the first test pattern generation section or the second test pattern generation section, respectively, depending on the signal value of the second clock, thereby inputting the selected test data to the memory as third test data.

With this configuration, the first test pattern generation section generates the first test data depending on the second clock having half the frequency of the first clock supplied to the memory. In addition, the second test pattern generation section generates the second test data depending on the second clock. Furthermore, the test data selection section selects either the first or second test data depending on the signal value of the second clock and inputs the selected test data to the memory as the third test data. Hence, the second invention has effects similar to those of the first invention.

A semiconductor integrated circuit in accordance with a third invention comprises a memory operating on a first clock, a test pattern generation section, operating on a second clock having half the frequency of the first clock, for generating first test data, an LSB0 processing section for generating second test data by adding numeric value 0 to the first test data generated by the test pattern generation section as the least significant bit thereof, an LSB1 processing section for generating third test data by adding numeric value 1 to the first test data generated by the test pattern generation section as the least significant bit thereof, and a test data selection section for selectively outputting either the second or third test data being output from the LSB0 processing section or the LSB1 processing section, respectively, depending on the signal value of the second clock, thereby inputting the selected test data to the memory as fourth test data.

With this configuration, the test pattern generation section generates the first test data depending on the second clock having half the frequency of the first clock supplied to the memory. In addition, the LSB0 processing section generates the second test data by adding numeric value 0 to the first test data as the least significant bit thereof, and the LSB1 processing section generates the third test data by adding numeric value 1 to the first test data as the least significant bit thereof. Furthermore, the test data selection section selectively outputs either the second or third test data depending on the signal value of the second clock. Therefore, even when the operation speed of the test pattern generation section, the LSB0 processing section, the LSB1 processing section and the test data selection section is restricted to half the operation speed of the memory, the memory can be tested at its actual operation speed. Since the test can be carried out even when the operation speed of the test pattern generation section, the LSB0 processing section, the LSB1 processing section and the test data selection section is low, the drive capability of the integrated circuit can be small, whereby the area of the circuit can be small and the power consumption of the circuit can be reduced.

In the configuration of the above-mentioned third invention, a delay circuit for generating a delay clock obtained by delaying the second clock and for supplying the delay clock to the test data selection section may be provided.

With this configuration, since the delay clock is obtained by delaying the second clock, a hold time can secured for the first clock, whereby a test pattern can be applied stably to the memory operating at high speed.

A semiconductor integrated circuit in accordance with a fourth invention comprises a memory operating on a first clock, a test pattern generation section, operating on a second clock having half the frequency of the first clock, for generating first test data, an LSB0 processing section for generating second test data by adding numeric value 0 to the first test data generated by the test pattern generation section as the least significant bit thereof, an LSB1 processing section for generating third test data by adding numeric value 1 to the first test data generated by the test pattern generation section as the least significant bit thereof, a clock selection section capable of selecting either the second clock or the inverted clock of the second clock, and a test data selection section for selectively outputting either the second or third test data being output from the LSB0 processing section or the LSB1 processing section, respectively, depending on the output of the clock selection section, thereby inputting the selected test data to the memory as fourth test data.

With this configuration, the clock selection section selects either the second clock or the inverted clock of the second clock, and the test data selection section selects either the second or third test data depending on the selected clock. By reversing the state of the selection by the clock selection section, the timing for selecting the second and third test data can be reversed. As a result, the quality of a test pattern can be raised. In addition, when an address signal is supplied as a test pattern, the increment and decrement of the address signal can be carried out selectively. The other effects are similar to those of the third invention.

A semiconductor integrated circuit in accordance with a fifth invention comprises a memory operating on a first clock, a memory device for capturing first output data being output from the memory in synchronization with the first clock, depending on a second clock having half the frequency of the first clock, and an expected value comparison section, operating on the second clock, for respectively comparing second output data being output from the memory device and third output data being output from the memory immediately after the output of the first output data with a predetermined expected value.

With this configuration, the memory device captures the first output data being output from the memory in synchronization with the first clock, depending on the inverted clock of the second clock having half the frequency of the first clock supplied to the memory. Then, the second output data being output from the memory device and the third output data being output from the memory immediately after the output of the first output data are respectively compared with the predetermined expected value depending on the second clock in the expected value comparison section. Therefore, even when the operation speed of the memory device and the expected value comparison section is restricted to half the operation speed of the memory, the memory can be tested at its actual operation speed. Since the test can be carried out even when the operation speed of the memory device and the expected value comparison section is low, the drive capability of the integrated circuit can be small, whereby the area of the circuit can be small and the power consumption of the circuit can be reduced.

A semiconductor integrated circuit in accordance with a sixth invention comprises a double data rate memory operating on a first clock, a first test pattern generation section, operating on a second clock having the same frequency as that of the first clock, for generating first test data, a second test pattern generation section, operating on a third clock, the inverted clock of the second clock, for generating second test data, and a test data selection section for selectively outputting either the first or second test data being output from the first test pattern generation section or the second test pattern generation section, respectively, depending on either the signal value of the second clock or the signal value of the third clock, thereby inputting the selected test data to the double data rate memory as third test data.

With this configuration, the first test pattern generation section generates the first test data depending on the second clock having the same frequency as that of the first clock supplied to the double data rate memory. In addition, the second test pattern generation section generates the second test data depending on the third clock, the inverted clock of the second clock. Furthermore, the test data selection section selects either the first or second test data depending on either the signal value of the second clock or the signal value of the third clock and inputs the selected test data to the double data rate memory as the third test data. Hence, even when the operation speed of the first and second test pattern generation sections and the test data selection section is restricted to the same operation speed as that of the double data rate memory, the double data rate memory can be tested at its actual operation speed. Since the test can be carried out even when the operation speed of the first and second test pattern generation sections and the test data selection section is low, the drive capability of the integrated circuit can be small, whereby the area of the circuit can be small and the power consumption of the circuit can be reduced.

A semiconductor integrated circuit in accordance with a seventh invention comprises a double data rate memory operating on a first clock, a first test pattern generation section, operating on a second clock having the same frequency of that of the first clock, for generating first test data, a second test pattern generation section, operating on the second clock, for generating second test data, and a test data selection section for selectively outputting either the first or second test data being output from the first test pattern generation section or the second test pattern generation section, respectively, depending on the signal value of the second clock, thereby inputting the selected test data to the double data rate memory as third test data.

With this configuration, the first test pattern generation section generates the first test data depending on the second clock having the same frequency as that of the first clock supplied to the double data rate memory. In addition, the second test pattern generation section generates the second test data depending on the second clock. Furthermore, the test data selection section selects either the first or second test data depending on the signal value of the second clock and inputs the selected test data to the double data rate memory as the third test data. Hence, even when the operation speed of the first and second test pattern generation sections and the test data selection section is restricted to the same operation speed as that of the double data rate memory, the double data rate memory can be tested at its actual operation speed. Since the test can be carried out even when the operation speed of the first and second test pattern generation sections and the test data selection section is low, the drive capability of the integrated circuit can be small, whereby the area of the circuit can be small and the power consumption of the circuit can be reduced.

A semiconductor integrated circuit in accordance with an eighth invention comprises a double data rate memory operating on a first clock, a test pattern generation section, operating on a second clock having the same frequency as that of the first clock, for generating first test data, an LSB0 processing section for generating second test data by adding numeric value 0 to the first test data generated by the test pattern generation section as the least significant bit thereof, an LSB1 processing section for generating third test data by adding numeric value 1 to the first test data generated by the test pattern generation section as the least significant bit thereof, and a test data selection section for selectively outputting either the second or third test data being output from the LSB0 processing section or the LSB1 processing section, respectively, depending on the signal value of the second clock, thereby inputting the selected test data to the double data rate memory as fourth test data.

With this configuration, the test pattern generation section generates the first test data depending on the second clock having the same frequency as that of the first clock supplied to the double data rate memory. In addition, the LSB0 processing section generates the second test data by adding numeric value 0 to the first test data as the least significant bit thereof, and the LSB1 processing section generates the third test data by adding numeric value 1 to the first test data as the least significant bit thereof. Furthermore, the test data selection section selectively outputs either the second or third test data depending on the signal value of the second clock. Therefore, even when the operation speed of the test pattern generation section, the LSB0 processing section, the LSB1 processing section and the test data selection section is restricted to the same operation speed as that of the double data rate memory, the double data rate memory can be tested at its actual operation speed. Since the test can be carried out even when the operation speed of the test pattern generation section, the LSB0 processing section, the LSB1 processing section and the test data selection section is low, the drive capability of the integrated circuit can be small, whereby the area of the circuit can be small and the power consumption of the circuit can be reduced.

In the configuration of the eighth invention, a delay circuit for generating a delay clock obtained by delaying the second clock and for supplying the delay clock to the test data selection section may be provided.

With this configuration, since the delay clock is obtained by delaying the second clock, a hold time can secured for the first clock, whereby a test pattern can be applied stably to the double data rate memory operating at high speed.

A semiconductor integrated circuit in accordance with a ninth invention comprises a double data rate memory operating on a first clock, a test pattern generation section, operating on a second clock having the same frequency as that of the first clock, for generating first test data, an LSB0 processing section for generating second test data by adding numeric value 0 to the first test data generated by the test pattern generation section as the least significant bit thereof, an LSB1 processing section for generating third test data by adding numeric value 1 to the first test data generated by the test pattern generation section as the least significant bit thereof, a clock selection section capable of selecting either the second clock or the inverted clock of the second clock, and a test data selection section for selectively outputting either the second or third test data being output from the LSB0 processing section or the LSB1 processing section, respectively, depending on the output of the clock selection section, thereby inputting the selected test data to the double data rate memory as fourth test data.

With this configuration, the clock selection section selects either the second clock or the inverted clock of the second clock, and the test data selection section selects either the second or third test data depending on the selected clock. By reversing the state of the selection by the clock selection section, the timing for selecting the second and third test data can be reversed. As a result, the quality of a test pattern can be raised. In addition, when an address signal is supplied as a test pattern, the increment and decrement of the address signal can be carried out selectively. The other effects are similar to those of the eighth invention.

A semiconductor integrated circuit in accordance with a 10th invention comprises a double data rate memory operating on a first clock, a memory device for capturing first output data being output from the double data rate memory in synchronization with the first clock, depending on a second clock having the same frequency as that of the first clock, and an expected value comparison section, operating on the second clock, for respectively comparing second output data being output from the memory device and third output data being output from the double data rate memory immediately after the output of the first output data with a predetermined expected value.

With this configuration, the memory device captures the first output data being output from the double data rate memory in synchronization with the first clock, depending on the inverted clock of the second clock having the same frequency as that of the first clock supplied to the double data rate memory. Then, the second output data being output from the memory device and the third output data being output from the double data rate memory immediately after the output of the first output data are respectively compared with the predetermined expected value depending on the second clock in the expected value comparison section. Therefore, even when the operation speed of the memory device and the expected value comparison section is restricted to the same operation speed as that of the double data rate memory, the double data rate memory can be tested at its actual operation speed. Since the test can be carried out even when the operation speed of the memory device and the expected value comparison section is low, the drive capability of the integrated circuit can be small, whereby the area of the circuit can be small and the power consumption of the circuit can be reduced.

A memory test method in accordance with an 11th invention is a method of testing a memory operating on a first clock, comprising the steps of generating first test data depending on a second clock having half the frequency of the first clock, generating second test data depending on a third clock, the inverted clock of the second clock, selecting either the first or second test data depending on either the signal value of the second clock or the signal value of the third clock, and inputting the selected test data to the memory as third test data.

With this method, the memory operating on the first clock can be tested depending on the second clock having half the frequency of the first clock. Since the frequency of the second clock can be low at this time, the drive capability of the circuit for the test can be small, whereby the area of the circuit can be small and the power consumption of the circuit can be reduced.

A memory test method in accordance with a 12th invention is a method of testing a memory operating on a first clock, comprising the steps of generating first test data depending on a second clock having half the frequency of the first clock, generating second test data by adding numeric value 0 to the first test data as the least significant bit thereof, generating third test data by adding numeric value 1 to the first test data as the least significant bit thereof, selecting either the second or third test data depending on the signal value of the second clock, and inputting the selected test data to the memory.

With this method, effects similar to those of the 11th invention are obtained.

A memory test method in accordance with a 13th invention is a method of testing a memory operating on a first clock, comprising the steps of holding first data being output from the memory in synchronization with the first clock as second data depending on a second clock having half the frequency of the first clock, and respectively comparing the second data and third data being output in synchronization with the first clock from the memory immediately after the output of the first data with a predetermined expected value depending on the second clock.

With this method, effects similar to those of the 11th invention are obtained.

A memory test method in accordance with a 14th invention is a method of testing a double data rate memory operating on a first clock, comprising the steps of generating first test data depending on a second clock having the same frequency as that of the first clock, generating second test data depending on a third clock, the inverted clock of the second clock, selecting either the first or second test data depending on either the signal value of the second clock or the signal value of the third clock, and inputting the selected test data to the double data rate memory as third test data.

With this method, the double data rate memory operating on the first clock can be tested depending on the second clock having the same frequency as that of the first clock. Since the frequency of the second clock is not required to be increased to double the frequency of the first clock but can be low at this time, the drive capability of the circuit for the test can be small, whereby the area of the circuit can be small and the power consumption of the circuit can be reduced.

A memory test method in accordance with a 15th invention is a method of testing a double data rate memory operating on a first clock, comprising the steps of generating first test data depending on a second clock having the same frequency as that of the first clock, generating second test data by adding numeric value 0 to the first test data as the least significant bit thereof, generating third test data by adding numeric value 1 to the first test data as the least significant bit thereof, selecting either the second or third test data depending on the signal value of the second clock, and inputting the selected test data to the double data rate memory.

With this method, effects similar to those of the 14th invention are obtained.

A memory test method in accordance with a 16th invention is a method of testing a double data rate memory operating on a first clock, comprising the steps of holding first data being output from the double data rate memory in synchronization with the first clock as second data depending on a second clock having the same frequency as that of the first clock, and respectively comparing the second data and third data being output in synchronization with the first clock from the double data rate memory immediately after the output of the first data with a predetermined expected value depending on the second clock.

With this method, effects similar to those of the 14th invention are obtained.

In the configurations of the above-mentioned first, second, sixth and seventh invention, a delay circuit for generating a delay clock obtained by delaying the second clock and for supplying the delay clock to the test data selection section may be provided.

With this configuration, since the delay clock is obtained by delaying the second clock, a hold time can secured for the first clock, whereby a test pattern can be applied stably to the memory operating at high speed.

A semiconductor integrated circuit in accordance with a 17th invention comprises a memory operating on a first clock, a first test pattern generation section, operating on a second clock having half the frequency of the first clock, for generating first test data, a second test pattern generation section, operating on a third clock, the inverted clock of the second clock, for generating second test data, a clock selection section capable of selecting either the second clock or the inverted clock of the second clock, and a test data selection section for selectively outputting either the first or second test data being output from the first test pattern generation section or the second test pattern generation section, respectively, depending on the output of the clock selection section, thereby inputting the selected test data to the memory as third test data.

A semiconductor integrated circuit in accordance with an 18th invention comprises a memory operating on a first clock, a first test pattern generation section, operating on a second clock having half the frequency of the first clock, for generating first test data, a second test pattern generation section, operating on the second clock, for generating second test data, a clock selection section capable of selecting either the second clock or the inverted clock of the second clock, and a test data selection section for selectively outputting either the first or second test data being output from the first test pattern generation section or the second test pattern generation section, respectively, depending on the output of the clock selection section, thereby inputting the selected test data to the memory as third test data.

A semiconductor integrated circuit in accordance with a 19th invention comprises a double data rate memory operating on a first clock, a first test pattern generation section, operating on a second clock having the same frequency as that of the first clock, for generating first test data, a second test pattern generation section, operating on a third clock, the inverted clock of the second clock, for generating second test data, a clock selection section capable of selecting either the second clock or the inverted clock of the second clock, and a test data selection section for selectively outputting either the first or second test data being output from the first test pattern generation section or the second test pattern generation section, respectively, depending on the output of the clock selection section, thereby inputting the selected test data to the double data rate memory as third test data.

A semiconductor integrated circuit in accordance with a 20th invention comprises a double data rate memory operating on a first clock, a first test pattern generation section, operating on a second clock having the same frequency as that of the first clock, for generating first test data, a second test pattern generation section, operating on the second clock, for generating second test data, a clock selection section capable of selecting either the second clock or the inverted clock of the second clock, and a test data selection section for selectively outputting either the first or second test data being output from the first test pattern generation section or the second test pattern generation section, respectively, depending on the output of the clock selection section, thereby inputting the selected test data to the double data rate memory as third test data.

With these configurations, the clock selection section selects either the second clock or the inverted clock of the second clock, and the test data selection section selects either the first or second test data depending on the selected clock. By reversing the state of the selection by the clock selection section, the timing for selecting the first and second test data can be reversed. As a result, the quality of a test pattern can be raised. In addition, when an address signal is supplied as a test pattern, the increment and decrement of the address signal can be carried out selectively. The other effects are similar to those of the first, second sixth or seventh invention.

In the above descriptions, the memory is an ordinary data rate memory operating in synchronization with either the rising edge or falling edge of a clock, and the double data rate memory is a memory operating in synchronization with both the rising and falling edges of a clock.

DETAILED DESCRIPTION OF THE PREFERRED EMBODIMENTS

Figure 1:
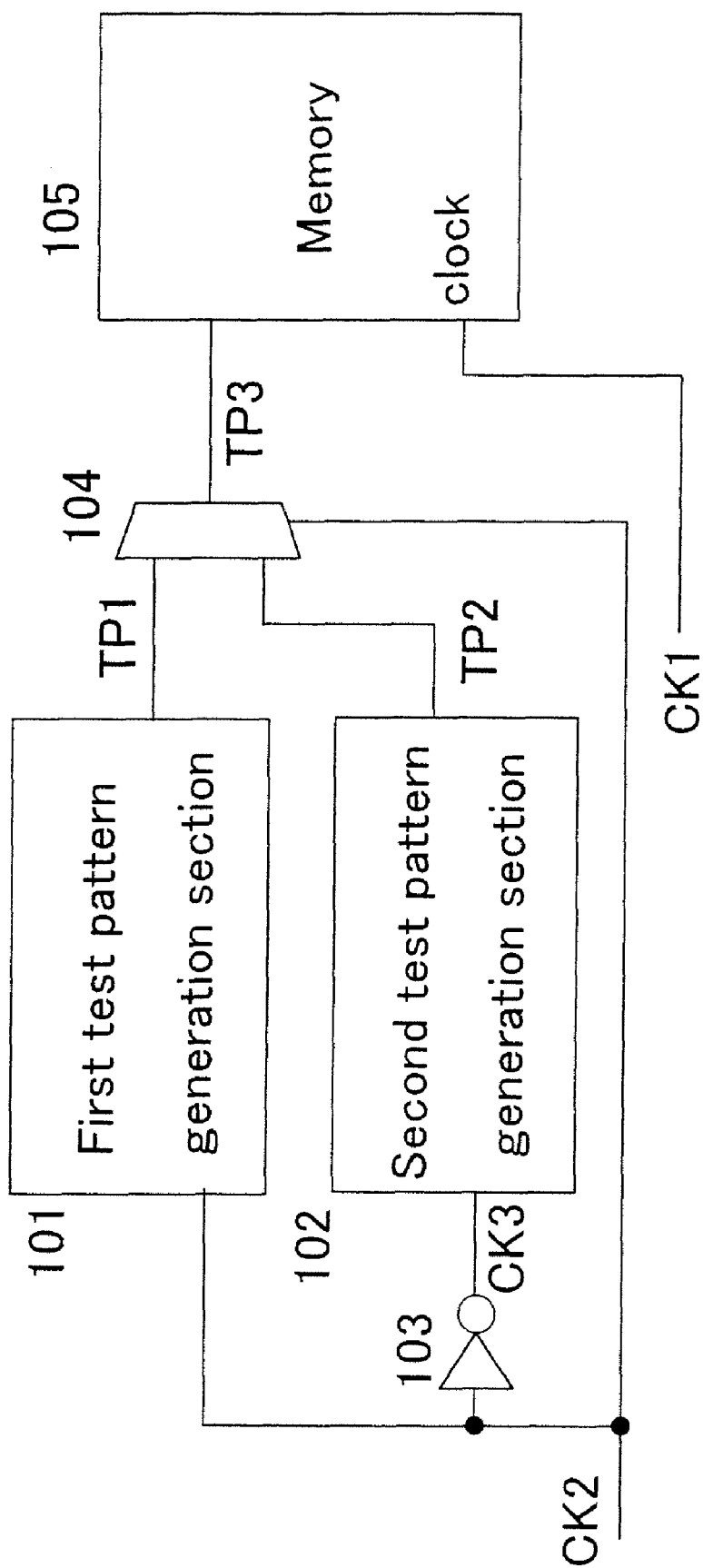
FIG. 1 is a block diagram showing the configuration of a semiconductor integrated circuit in accordance with a first embodiment of the present invention.

Embodiments in accordance with the present invention will be described below referring to the drawings. The same or similar components are designated by the same numerals, and their explanations are not repeated.

First Embodiment

Figure 2:
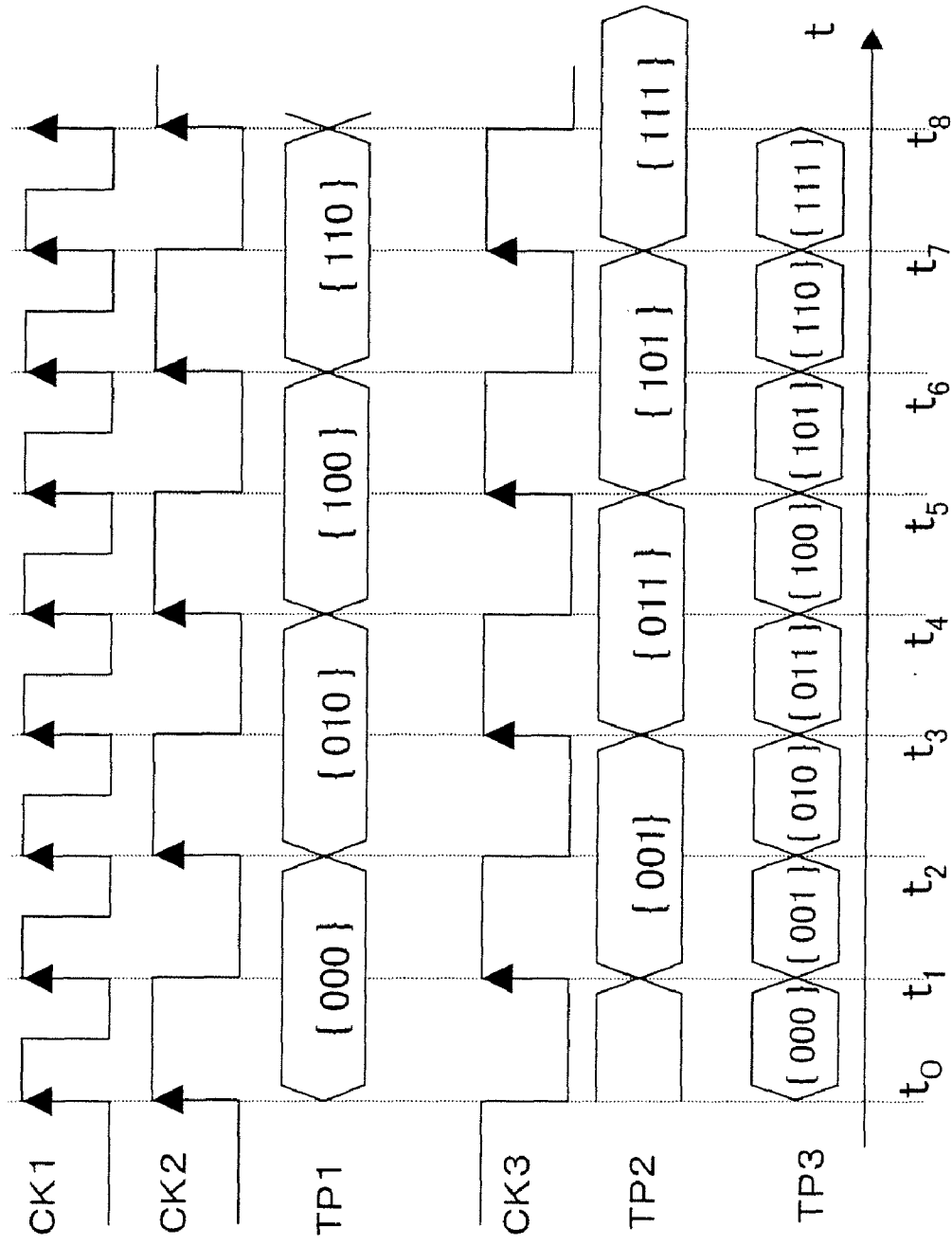
FIG. 2 is a timing chart illustrating the operation of the semiconductor integrated circuit in accordance with the first embodiment of the present invention.

FIG. 1 is a block diagram illustrating a semiconductor integrated circuit and a memory test method in accordance with a first embodiment of the present invention, and FIG. 2 is a timing chart at various sections of FIG. 1.

In FIG. 1, numeral 101 designates a first test pattern generation section operating in synchronization with the rising edge of an input clock. Numeral 102 designates a second test pattern generation section operating in synchronization with the rising edge of an input clock. Numeral 103 designates an inverter for generating an inverted clock. Numeral 104 designates a test data selection section. These constitute a BIST circuit. Numeral 105 designates an ordinary data rate memory to be subjected to a BIST, and the memory operates in synchronization with the rising edge of an input clock.

A first clock CK1 is a clock signal supplied to the memory 105. A second clock CK2 is a clock signal supplied to the first test pattern generation section 101, and its frequency is half the frequency of the first clock CK1. A third clock CK3 is a clock signal obtained by inverting the second clock CK2 using the inverter 103 and serves as the clock signal for the second test pattern generation section 102.

The first test pattern generation section 101 generates an address signal TP1, "000" at time t0, "010" at time t2, "100" at time t4, and "110" at time t6, as test data in synchronization with the rising edge of the second clock CK2 as shown in the timing chart of FIG. 2.

Furthermore, the second test pattern generation section 102 generates an address signal TP2, "001" at time t1, "011" at time t3, "101" at time t5, and "111" at time t7, as test data in synchronization with the rising edge of the third clock CK3 as shown in the timing chart of FIG. 2.

The test data selection section 104 alternately selects the address signals TP1 and TP2 generated by the first test pattern generation section 101 and the second test pattern generation section 102, respectively, depending on the logical value 0 or 1 of the second clock CK2, and outputs test data, that is, an address signal TP3. The test data selection section 104 may carry out the selection operation depending on the logical value 0 or 1 of the third clock CK3.

Assuming that the address signal TP1 is selected when the second clock CK2 is logical value 1 and that the address signal TP2 is selected when the second clock CK2 is logical value 0, the address signal TP3 being input to the memory 105 as test data is "000" at time t0, "001" at time t1, "010" at time t2, "011" at time t3, "100" at time t4, "101" at time t5, "110" at time t6 and "111" at time t7. As a result, a test pattern (a series of address signals) can be generated in synchronization with the rising edge of the first clock CK1 of the memory 105.

As described above, this embodiment comprises the first test pattern generation section 101 operating on the second clock CK2, the second test pattern generation section 102 operating on the third clock CK3 obtained by inverting the second clock CK2, and the test data selection section 104 for selecting either of the outputs of the first and second test pattern generation sections 101 and 102 depending on either of the states of the second and third clocks CK2 and CK3 and for inputting the selected output to the memory 105. With this configuration, a test pattern can be applied at the actual operation speed of the memory 105 to the memory 105 operating at double the frequency of the first and second test pattern generation sections 101 and 102. In other words, the memory 105 operating at the high frequency can be tested without doubling the operation frequency of the first and second test pattern generation sections 101 and 102 constituting the BIST circuit. Hence, the drive capability of the first and second test pattern generation sections 101 and 102 in carrying out a BIST can be small, whereby the area of the circuit can be small and the power consumption of the circuit can be reduced.

Figure 3:
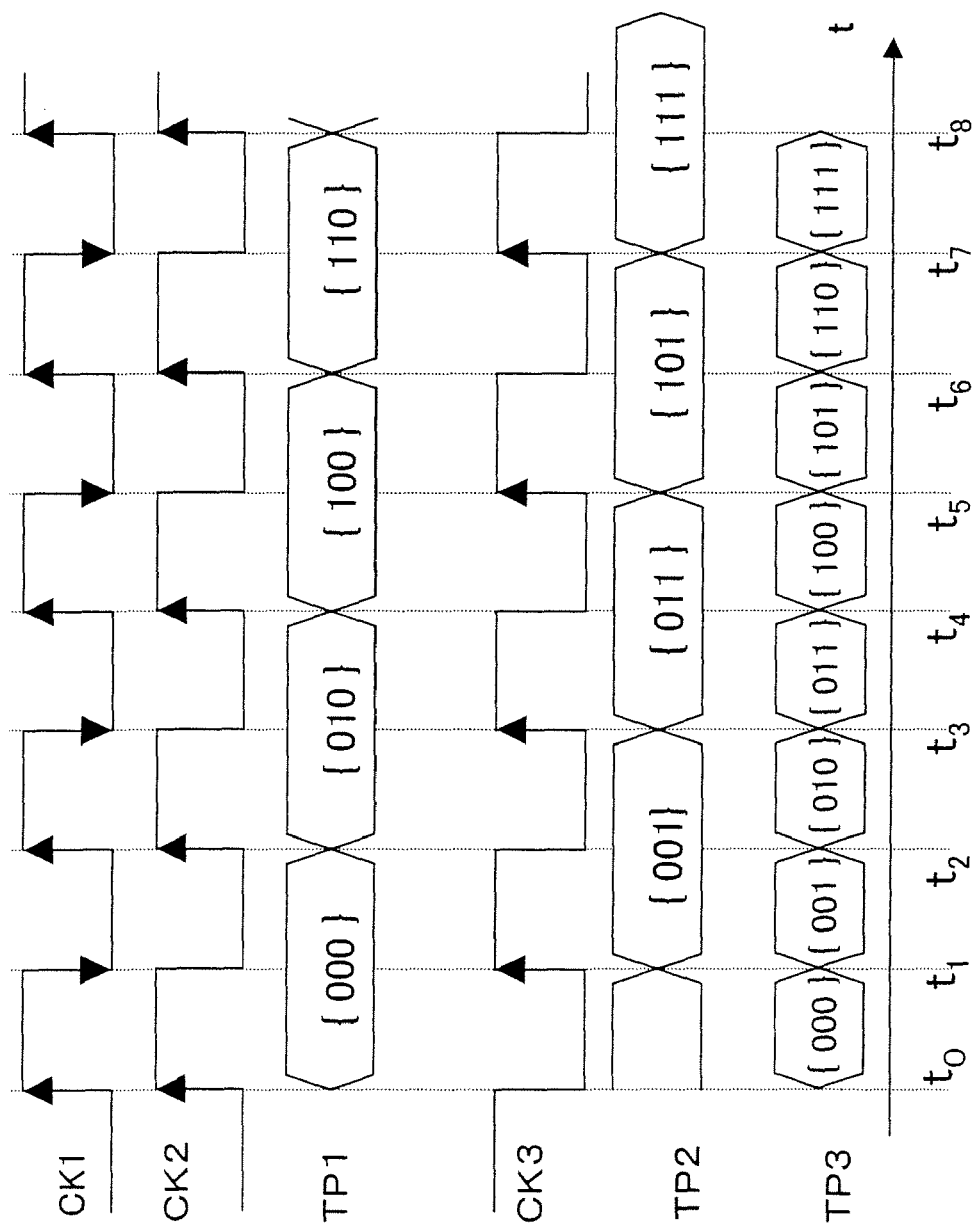
FIG. 3 is a timing chart illustrating the operation of the semiconductor integrated circuit in accordance with the first embodiment of the present invention.

In the case when the memory 105 is a DDR memory, as shown in the timing chart of FIG. 3, by inputting clock signals, having the same frequency, as the first clock CK1 supplied to the DDR memory and the second clock CK2 supplied to the BIST circuit, a test pattern can be input to the DDR memory in synchronization with both the rising and falling edges of the clock CK1, whereby effects similar to those of this embodiment can be obtained. In other words, the DDR memory can be tested without doubling the operation frequency of the first and second test pattern generation sections constituting the BIST circuit. Hence, the drive capability of the first and second test pattern generation sections 101 and 102 in carrying out a BIST can be small, whereby the area of the circuit can be small and the power consumption of the circuit can be reduced.

Furthermore, in the configuration shown in FIG. 1, the third clock CK3 obtained by inverting the second clock CK2 using the inverter 103 is supplied to the second test pattern generation section 102. However, even if the second clock CK2 is supplied directly, the address signal TP3 can be obtained, just as in the case when the third clock CK3 is supplied. In this case, however, the address signal TP2 advances by half the cycle of the second clock CK2 in comparison with the timing shown in FIG. 2.

Second Embodiment

Figure 4:
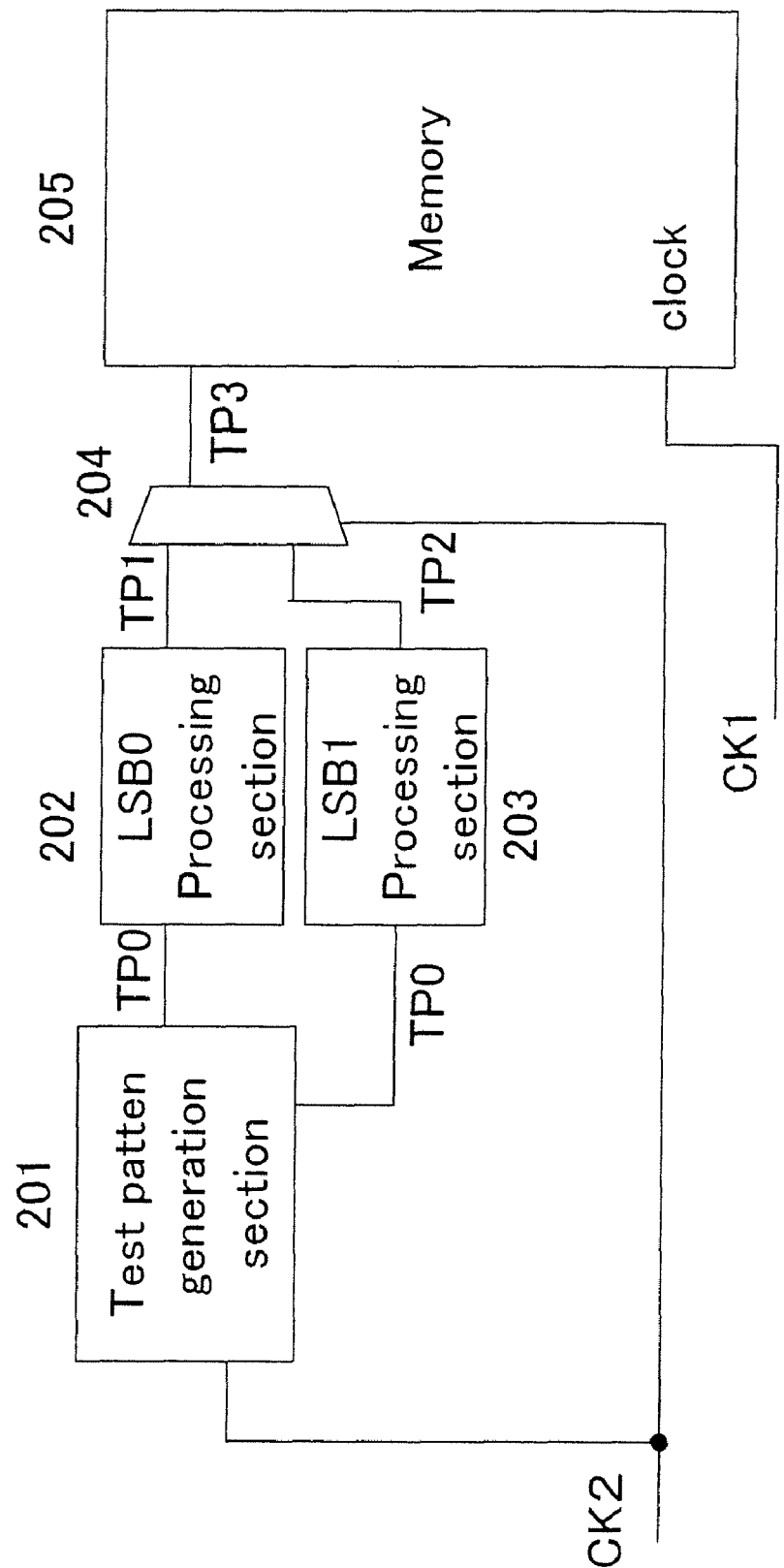
FIG. 4 is a block diagram showing the configuration of a semiconductor integrated circuit in accordance with a second embodiment of the present invention.
Figure 5:
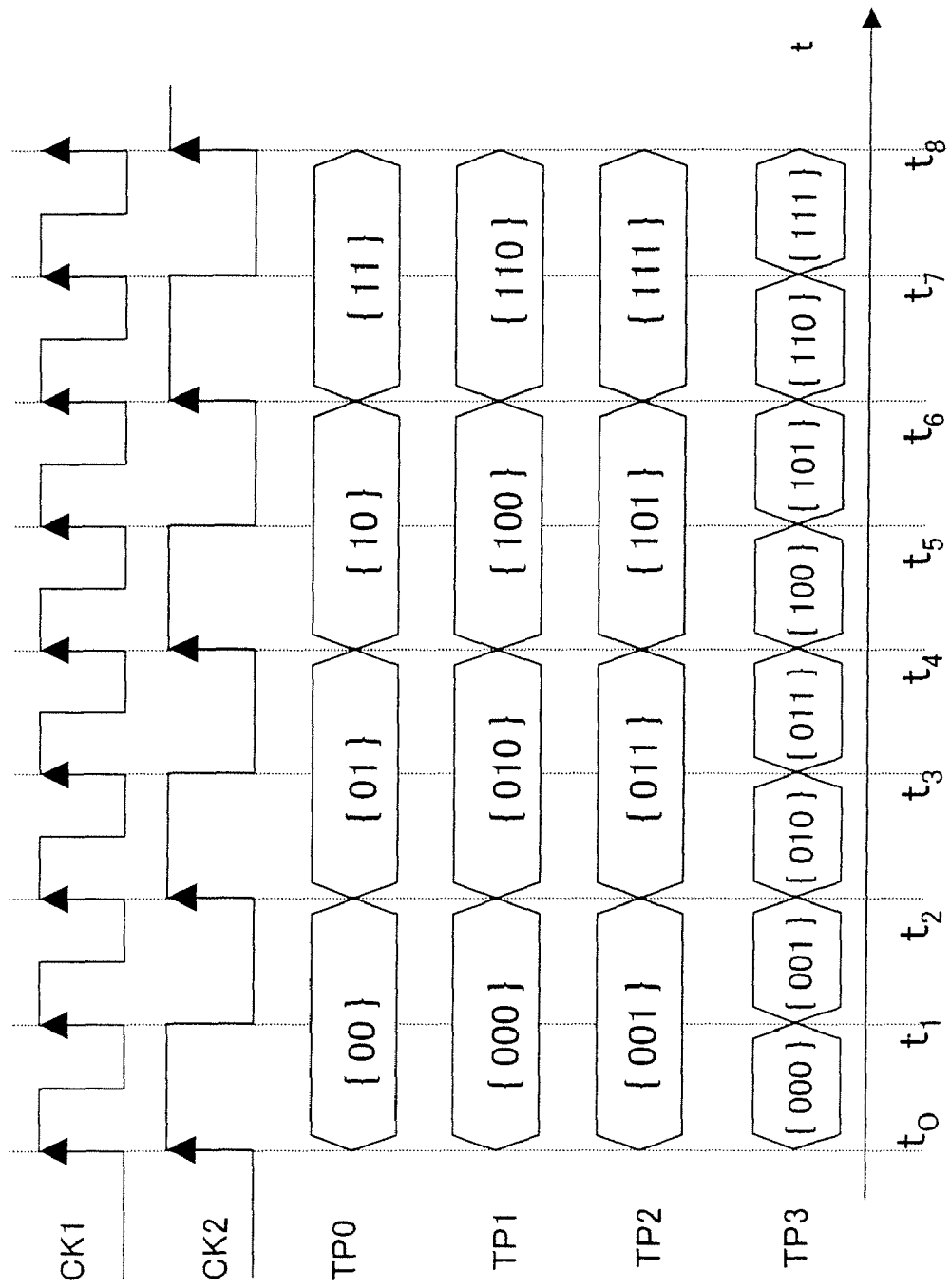
FIG. 5 is a timing chart illustrating the operation of the semiconductor integrated circuit in accordance with the second embodiment of the present invention.

FIG. 4 is a block diagram illustrating a semiconductor integrated circuit and a memory test method in accordance with a second embodiment of the present invention, and FIG. 5 is a timing chart.

The memory test method using the semiconductor integrated circuit shown in FIG. 4 will be described below on the basis of a flowchart shown in FIG. 7.

In FIG. 4, numeral 201 designates a test pattern generation section operating in synchronization with the rising edge of an input clock. Numeral 202 designates an LSB0 processing section, numeral 203 designates an LSB1 processing section, and numeral 204 designates a test data selection section. These constitute a BIST circuit. Numeral 205 designates an ordinary data rate memory to be subjected to a BIST, and the memory operates in synchronization with the rising edge of an input clock.

A first clock CK1 is a clock signal supplied to the memory 205. A second clock CK2 is a clock signal supplied to the test pattern generation section 201, and its frequency is half the frequency of the first clock CK1.

Figure 7:
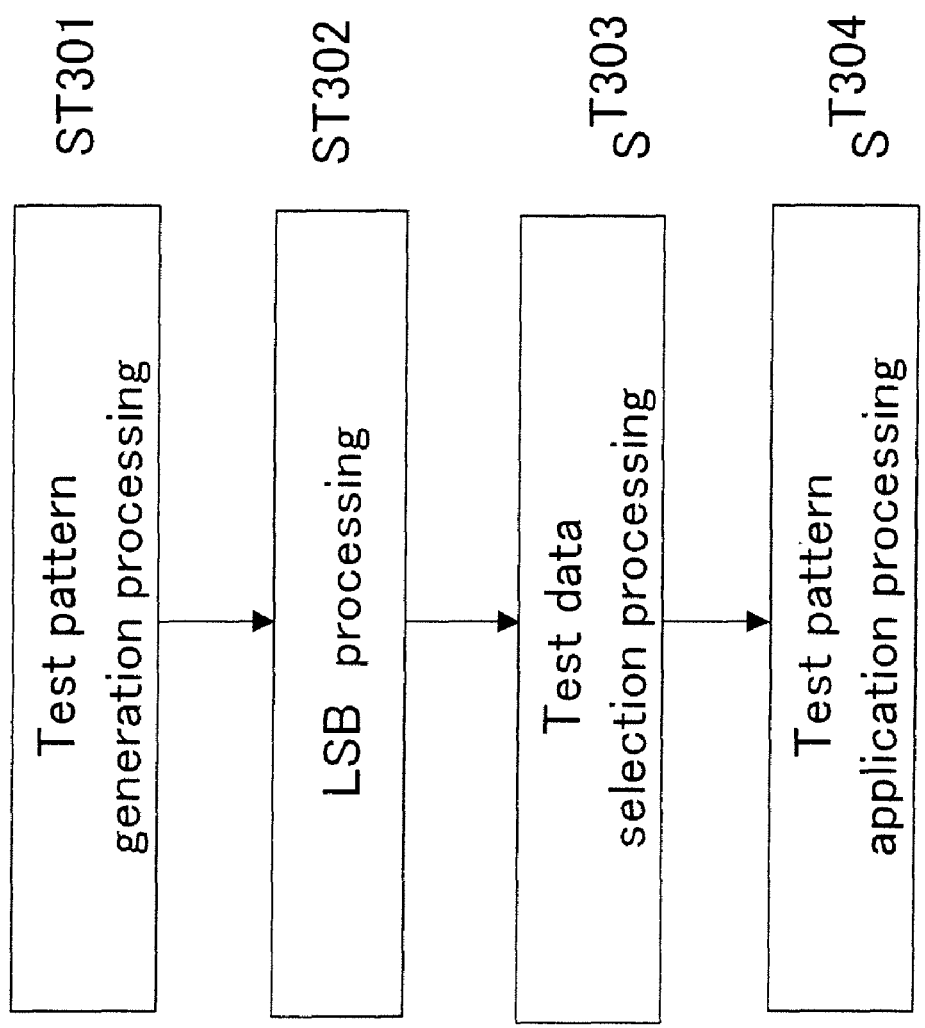
FIG. 7 is a flowchart showing a method of testing a memory in accordance with the first, second, third and fourth embodiments of the present invention.

In FIG. 7, first, a test pattern generation processing step ST301 is carried out. Test data is generated by the test pattern generation section 201 in synchronization with the rising edge of the second clock CK2. More specifically, {00} is generated as test data, that is, an address signal TP0, at time t0, {01} is generated as the address signal TP0 at time t2, {10} is generated as the address signal TP0 at time t4, and {11} is generated as the address signal TP0, at time t6.

Next, an LSB processing step ST302 is carried out. In other words, numeric value 0 or 1 is added to the address signal TP0 generated by the test pattern generation section 201 as the least significant bit thereof, thereby generating address signals TP1 and TP2.

More specifically, in the LSB0 processing section 202, numeric value 0 is added to the address signal TP0 as the least significant bit thereof, thereby generating the address signal TP1. Furthermore, in the LSB1 processing section 203, numeric value 1 is added to the address signal TP0 as the least significant bit thereof, thereby generating the address signal TP2. In the LSB0 processing section 202 and the LSB1 processing section 203, synchronization depending on a clock is not carried out. Instead, only the logical value "0" or "1" is simply added to the output of the test pattern generation section 201 as the LSB thereof. This is represented by verilog as follows:

assign TP1={TP0,0};

assign TP2={TP0,1};

As shown in the timing chart of FIG. 5, at time t0, numeric value 0 is added as the least significant bit to the two-bit address {00} generated as the address signal TP0 in the LSB0 processing section 202, whereby a three-bit address {000} is generated as the address signal TP1. In addition, numeric value 1 is added as the least significant bit to the address signal TP0 in the LSB1 processing section 203, whereby a three-bit address {001} is generated as the address signal TP2.

At time t2, numeric value 0 is added as the least significant bit to the two-bit address {01} generated as the address signal TP0 in the LSB0 processing section 202, whereby a three-bit address {010} is generated as the address signal TP1. In addition, numeric value 1 is added as the least significant bit to the address signal TP0 in the LSB1 processing section 203, whereby a three-bit address {011} is generated as the address signal TP2.

At time t4, numeric value 0 is added as the least significant bit to the two-bit address {10} generated as the address signal TP0 in the LSB0 processing section 202, whereby a three-bit address {100} is generated as the address signal TP1. In addition, numeric value 1 is added as the least significant bit to the address signal TP0 in the LSB1 processing section 203, whereby a three-bit address {101} is generated as the address signal TP2.

At time t6, numeric value 0 is added as the least significant bit to the two-bit address {11} generated as the address signal TP0 in the LSB0 processing section 202, whereby a three-bit address {110} is generated as the address signal TP1. In addition, numeric value 1 is added as the least significant bit to the address signal TP0 in the LSB1 processing section 203, whereby a three-bit address {111} is generated as the address signal TP2.

Next, test data selection processing step ST303 is carried out. At this step, the address signal TP1, that is, the test data generated by the LSB0 processing section 202 and the address signal TP2, that is, the test data generated by the LSB1 processing section 203, are selectively output as an address signal TP3 depending on the signal value of the second clock CK2.

The test data selection section 204 selects the address signal TP1 and outputs it to the memory 205 when the second clock CK2 has logical value 1, and selects the address signal TP2 and outputs it to the memory 205 when the second clock CK2 has logical value 0.

In the period from time t0 to time t1 in which the logical value of the second clock CK2 is 1, the test data selection section 204 outputs test data {000} as the address signal TP3. In the period from time t1 to time t2 in which the logical value of the second clock CK2 is 0, the test data selection section 204 outputs {001} as the address signal TP3.

In the period from time t2 to time t3 in which the logical value of the second clock CK2 is 1, the test data selection section 204 outputs {010} as the address signal TP3. In the period from time t3 to time t4 in which the logical value of the second clock CK2 is 0, the test data selection section 204 outputs {011} as the address signal TP3.

In the period from time t4 to time t5 in which the logical value of the second clock CK2 is 1, the test data selection section 204 outputs {100} as the address signal TP3. In the period from time t5 to time t6 in which the logical value of the second clock CK2 is 0, the test data selection section 204 outputs {101} as the address signal TP3.

In the period from time t6 to time t7 in which the logical value of the second clock CK2 is 1, the test data selection section 204 outputs {110} as the address signal TP3. In the period from time t7 to time t8 in which the logical value of the second clock CK2 is 0, the test data selection section 204 outputs {111} as the address signal TP3.

Next, test pattern application processing step ST304 is carried out. In this step, the address signal TP3 output from the test data selection section 204 is applied to the memory 205.

As described above, this embodiment comprises the single test pattern generation section 201 operating on the second clock CK2, the LSB0 processing section 202 for adding numeric value 0 as the least significant bit to the address signal TP0 output from the test pattern generation section 201, the LSB1 processing section 203 for adding numeric value 1 as the least significant bit to the address signal TP0, and the test data selection section 204 for selecting and outputting either the address signal TP1 of the LSB0 processing section 202 or the address signal TP2 of the LSB1 processing section 203. With this configuration, a test pattern can be applied at the actual operation speed of the memory 205 to the memory 205 operating at double the frequency of the test pattern generation section 201. In other words, the memory 205 operating at the high frequency can be tested without doubling the operation frequency of the test pattern generation section 201, the LSB0 processing section 202 and the LSB1 processing section 203 constituting the BIST circuit. Hence, the drive capability of the test pattern generation section 201, the LSB0 processing section 202 and the LSB1 processing section 203 in carrying out a BIST can be small, whereby the area of the circuit can be small and the power consumption of the circuit can be reduced.

Figure 6:
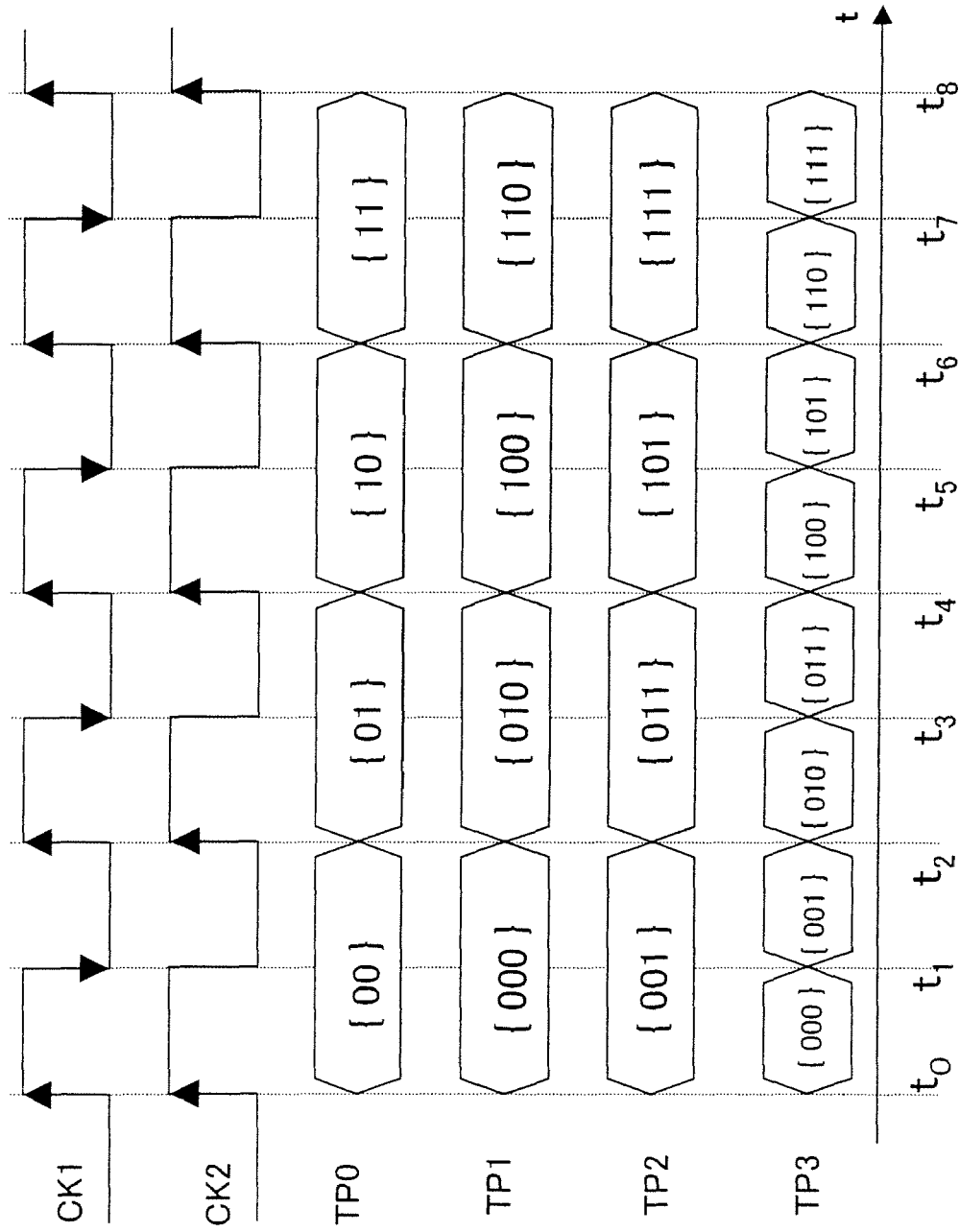
FIG. 6 is a timing chart illustrating the operation of the semiconductor integrated circuit in accordance with the second embodiment of the present invention.

In the case when the memory 205 is a DDR memory, as shown in the timing chart of FIG. 6, by inputting clock signals, having the same frequency, as the first clock CK1 supplied to the DDR memory and the second clock CK2 supplied to the BIST circuit, a test pattern can be input to the DDR memory in synchronization with both the rising and falling edges of the clock CK1, whereby effects similar to those of this embodiment can be obtained. In other words, the DDR memory can be tested without doubling the operation frequency of the test pattern generation section 201 constituting the BIST circuit. Hence, the drive capability of the test pattern generation section 201, the LSB0 processing section 202 and the LSB1 processing section 203 in carrying out a BIST can be small, whereby the area of the circuit can be small and the power consumption of the circuit can be reduced.

Third Embodiment

Figure 8:
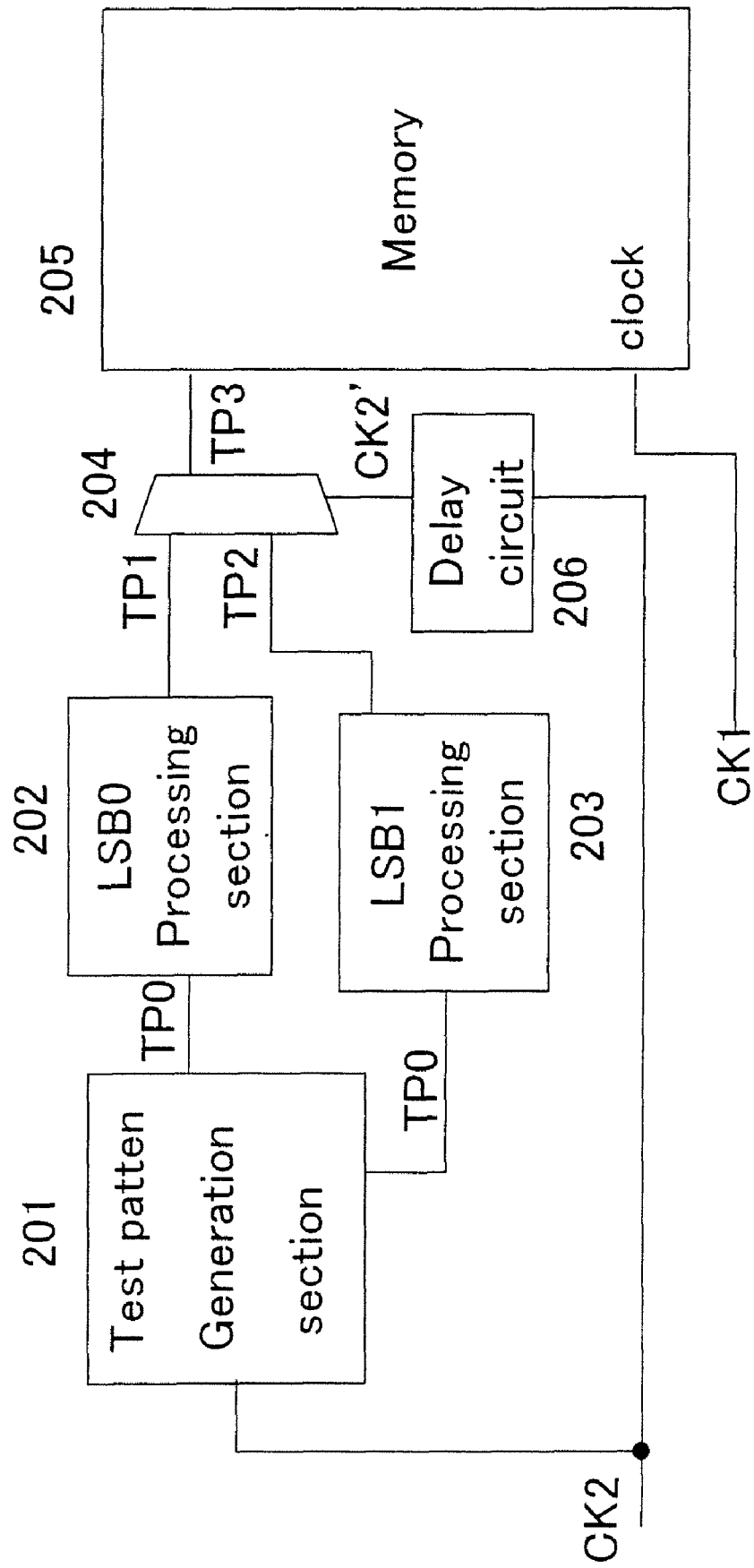
FIG. 8 is a block diagram showing the configuration of a semiconductor integrated circuit in accordance with a third embodiment of the present invention.
Figure 9:
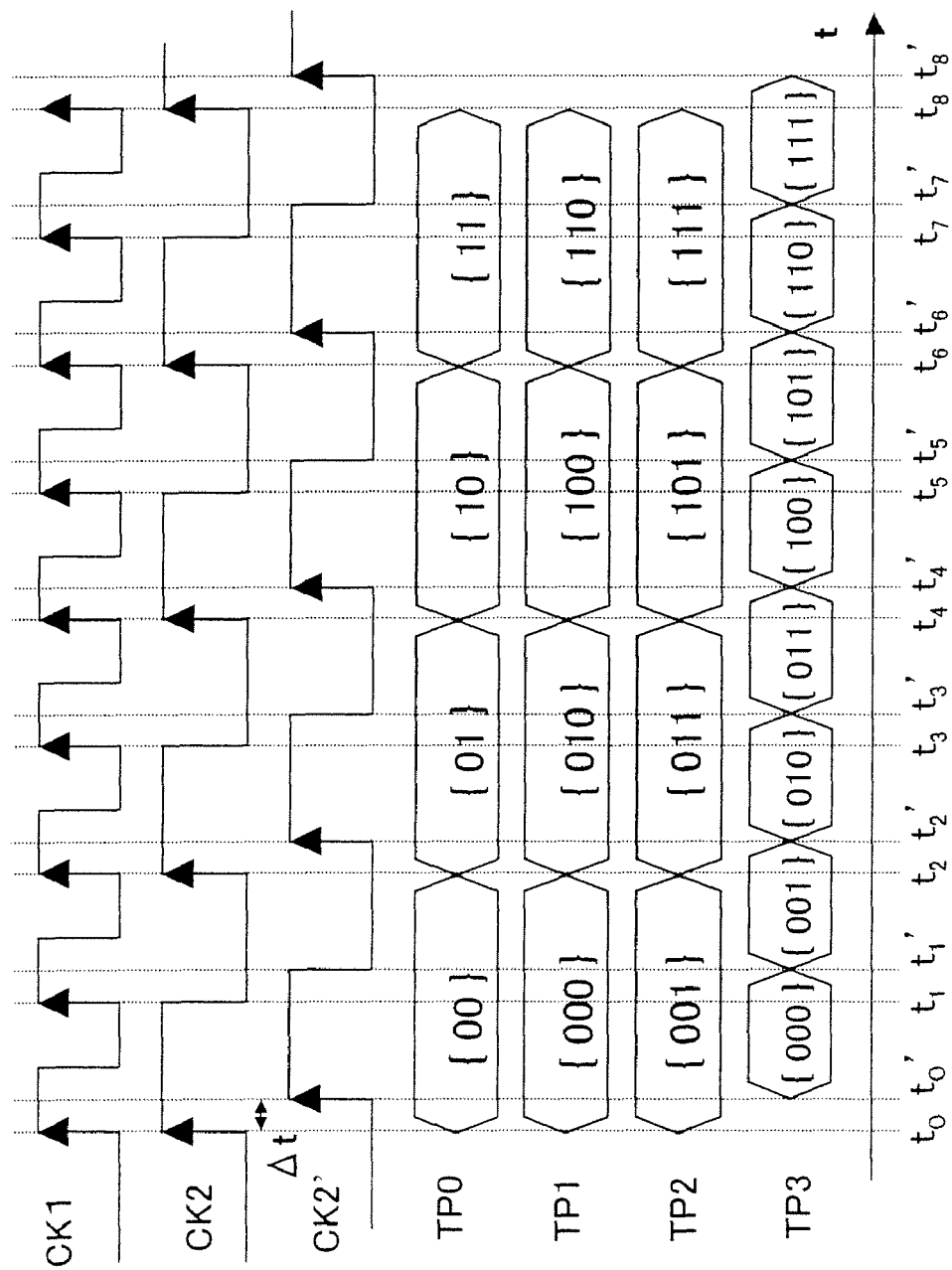
FIG. 9 is a timing chart illustrating the operation of the semiconductor integrated circuit in accordance with the third embodiment of the present invention.

FIG. 8 is a block diagram illustrating a semiconductor integrated circuit and a memory test method in accordance with a third embodiment of the present invention, and FIG. 9 is a timing chart.

The memory test method in the semiconductor integrated circuit shown in FIG. 8 will be described below on the basis of the flowchart of FIG. 7.

The semiconductor integrated circuit differs from the semiconductor integrated circuit shown in FIG. 4 in that the circuit is equipped with a delay circuit 206 for generating a delay clock CK2' obtained by delaying the second clock CK2. This delay circuit 206 is formed of, for example, a circuit for generating a constant delay time by arranging buffers or inverters in series or a delay device capable of generating the constant delay time.

The test data selection processing step ST303 and the test pattern application processing step ST304 in this embodiment will be described below.

At the test data selection processing step ST303, either the address signal TP1 generated by the LSB0 processing section 202 or the address signal TP2 generated by the LSB1 processing section 203 is selectively output depending on a delay clock CK2' obtained by delaying the second clock CK2 using the delay circuit 206. The selection processing is carried out by the test data selection section 204.

The test data selection section 204 selects the address signal TP1 when the delay clock CK2' has logical value 1, and selects the address signal TP2 when the delay clock CK2' has logical value 0.

In the period from time t0' to time t1' in which the logical value of the delay clock CK2' is 1, the test data selection section 204 outputs {000} as the address signal TP3, and in the period from time t1' to time t2' in which the logical value of the delay clock CK2' is 0, the test data selection section 204 outputs {001} as the address signal TP3.

In the period from time t2' to time t3' in which the logical value of the delay clock CK2' is 1, the test data selection section 204 outputs {010} as the address signal TP3, and in the period from time t3' to time t4' in which the logical value of the delay clock CK2' is 0, the test data selection section 204 outputs {011} as the address signal TP3.

In the period from time t4' to time t5' in which the logical value of the delay clock CK2' is 1, the test data selection section 204 outputs {100} as the address signal TP3, and in the period from time t5' to time t6' in which the logical value of the delay clock CK2' is 0, the test data selection section 204 outputs {101} as the address signal TP3.

In the period from time t6' to time t7' in which the logical value of the delay clock CK2' is 1, the test data selection section 204 outputs {110} as the address signal TP3, and in the period from time t7' to time t8' in which the logical value of the delay clock CK2' is 0, the test data selection section 204 outputs {111} as the address signal TP3.

In the test pattern application processing step ST304, the address signal TP3 output from the test data selection section 204 is applied to the memory 205 operating in synchronization with the rising edge of the first clock CK1.

As described above, in this embodiment, either the address signal TP1 generated by the LSB0 processing section 202 or the address signal TP2 generated by the LSB1 processing section 203 is selectively output depending on the delay clock CK2' obtained by delaying the second clock CK2 using the delay circuit 206. Hence, the test data to be input to the memory 205, that is, the address signal TP3, is input so as to be delayed by a constant delay value from the clock CK1 of the memory 205, whereby a hold time can be secured for the clock CK1 and a test pattern can be applied stably to the memory 205 operating at high speed.

The hold time and a setup time will be described herein. The memory 205 operates in synchronization with the rising edge of the clock CK1. At this time, if the values of the address and the data input signal supplied to the memory 205 have not yet been determined a constant time before the rising edge of the clock CK1, the address and the data are not input to the memory 205. This constant time is referred to as the setup time. In addition, it is necessary to hold the address and the data for a constant time after the clock CK1 has risen. This time is referred to as the hold time.

In addition, by the single test pattern generation section 201 operating on the clock CK2, a test pattern can be applied at the actual operation speed of the memory 205 to the memory 205 operating at double the frequency of the test pattern generation section 201, just as in the case of the second embodiment.

Figure 11:
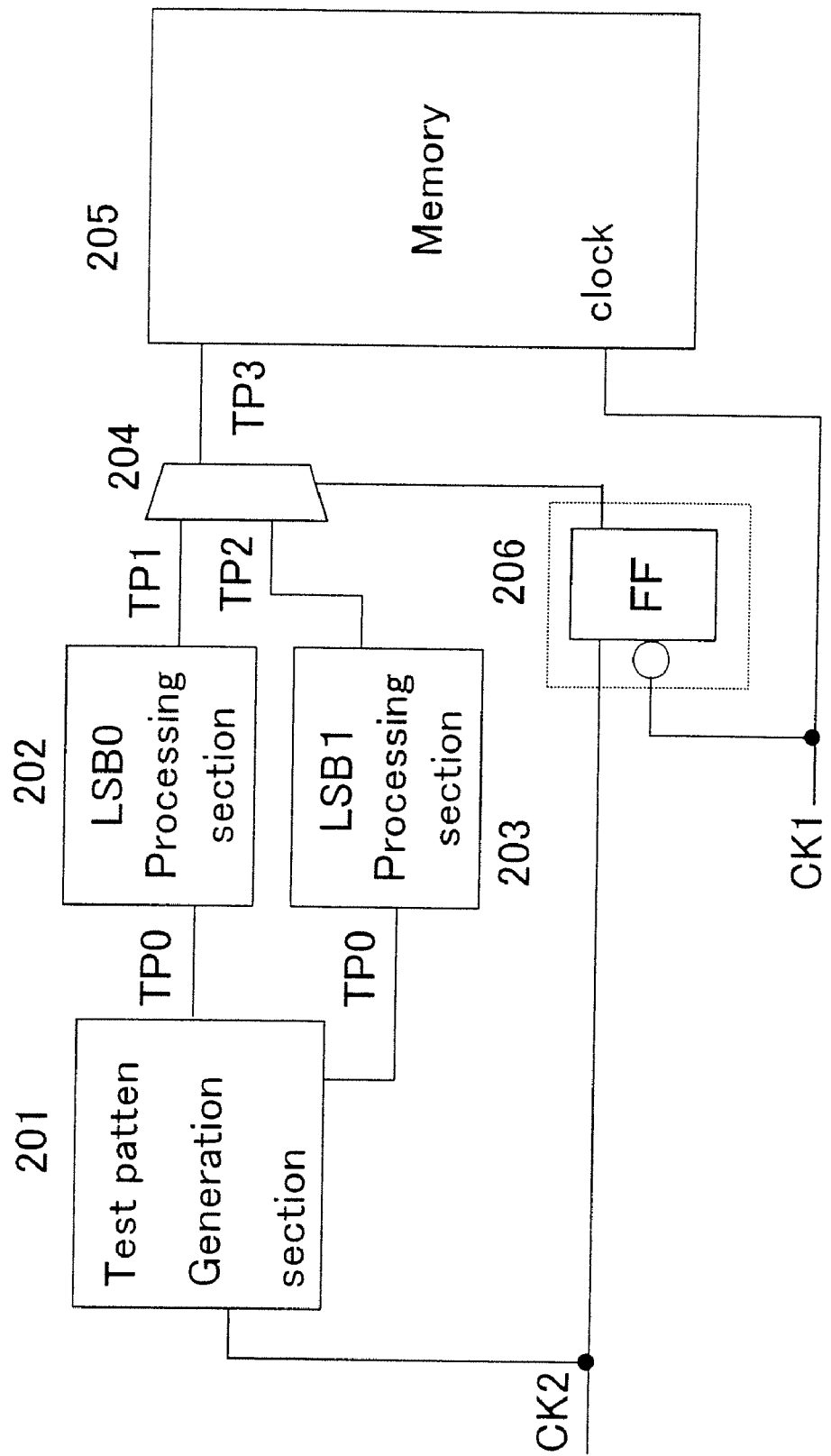
FIG. 11 is a block diagram showing a first specific example of a delay circuit for the semiconductor integrated circuit in accordance with the third embodiment of the present invention.
Figure 12:
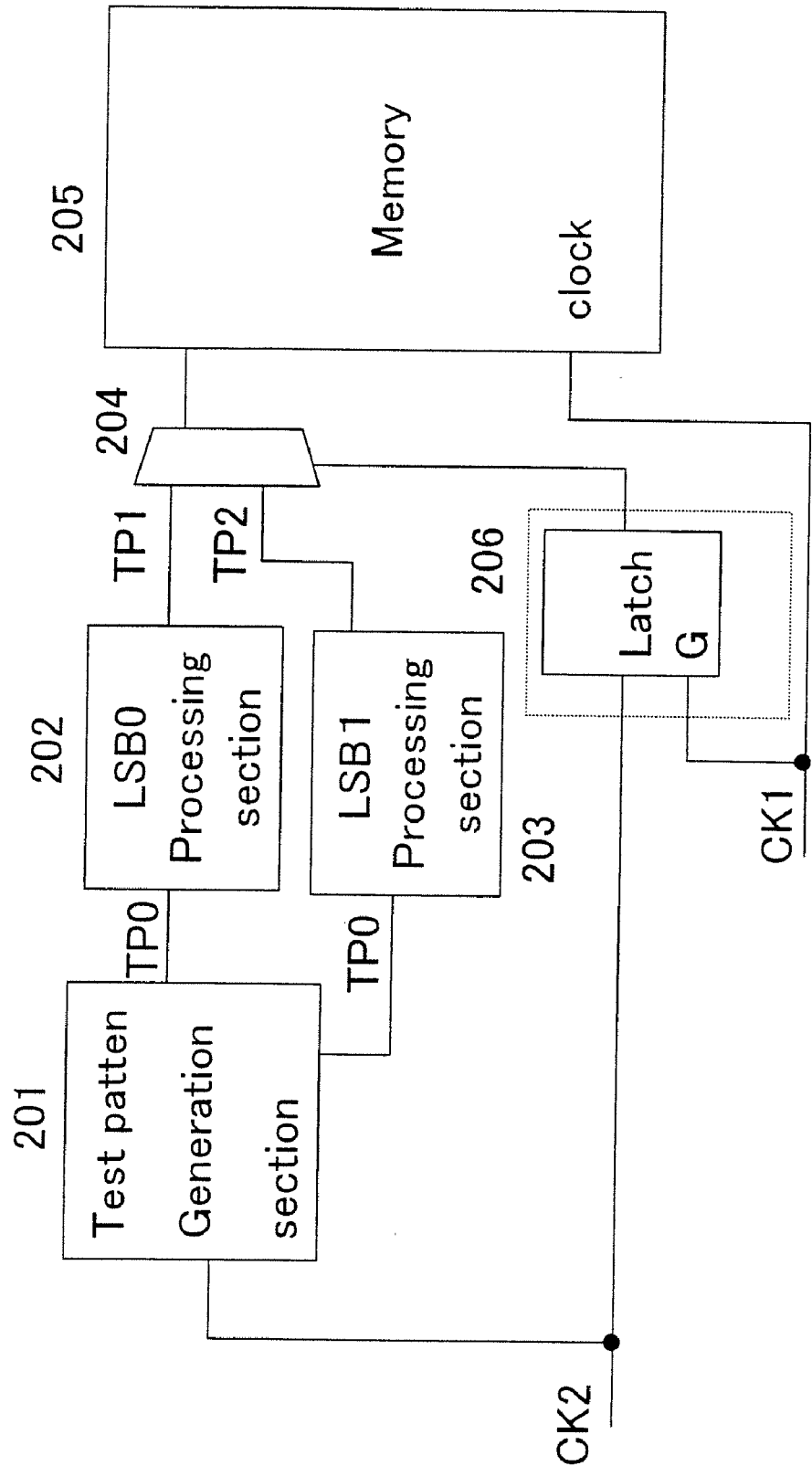
FIG. 12 is a block diagram showing a second specific example of a delay circuit for the semiconductor integrated circuit in accordance with the third embodiment of the present invention.

In the case when the memory operates on the clock CK1 having double the frequency of the clock CK2, effects similar to those of this embodiment can be obtained by using a flip-flop operating at the falling edge of the clock CK1 as shown in FIG. 11 or by using a latch wherein data passes through in the high-level period of the clock CK1 as shown in FIG. 12.

Figure 10:
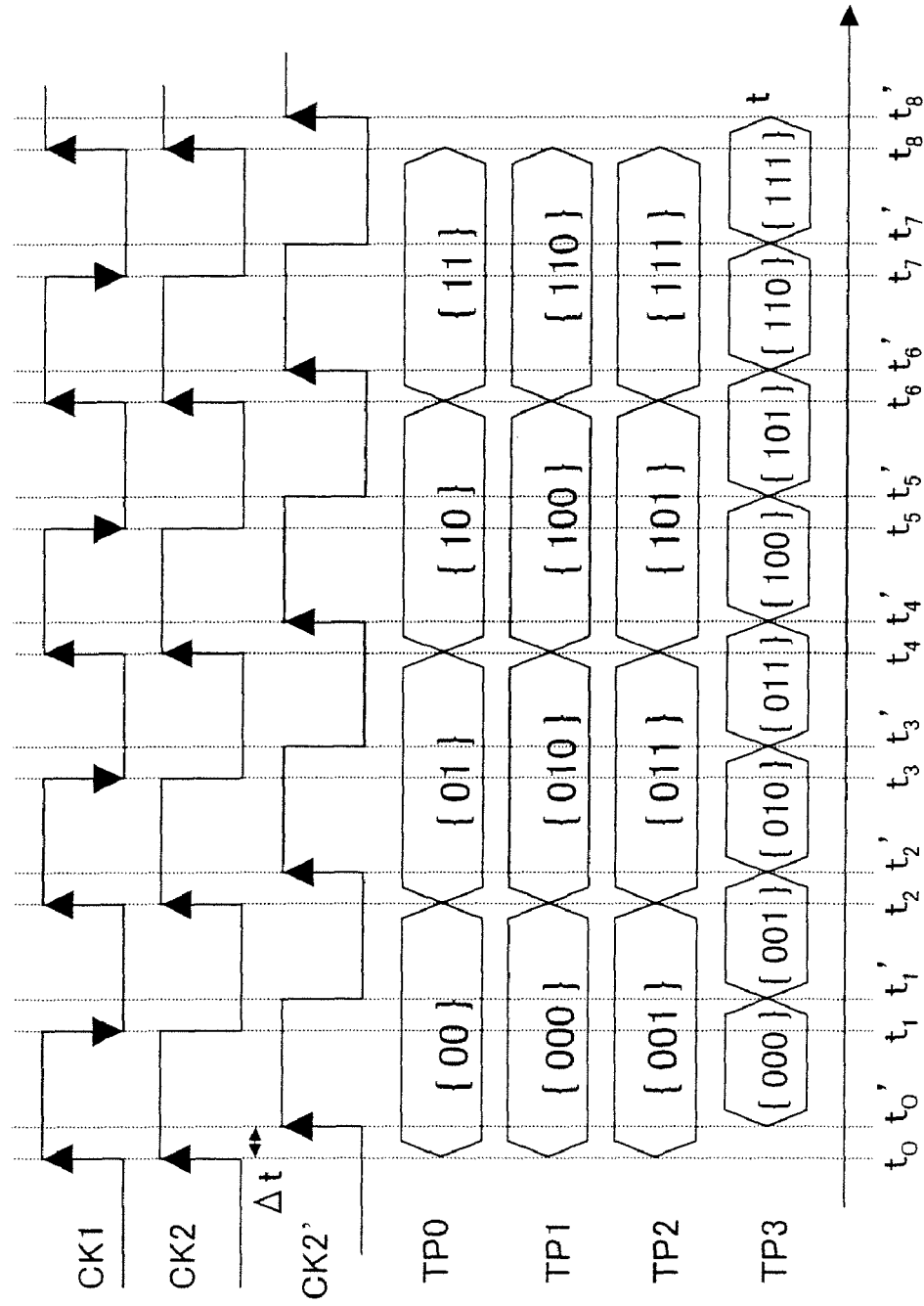
FIG. 10 is a timing chart illustrating the operation of the semiconductor integrated circuit in accordance with the third embodiment of the present invention.

In the case when the memory 205 is a DDR memory, as shown in the timing chart of FIG. 10, by inputting clock signals, having the same frequency, as the clock CK1 supplied to the DDR memory and the clock CK2 supplied to the BIST circuit, a test pattern can be input to the DDR memory in synchronization with both the rising and falling edges of the clock signal CK1, whereby effects similar to those of this embodiment can be obtained.

Fourth Embodiment

Figure 13:
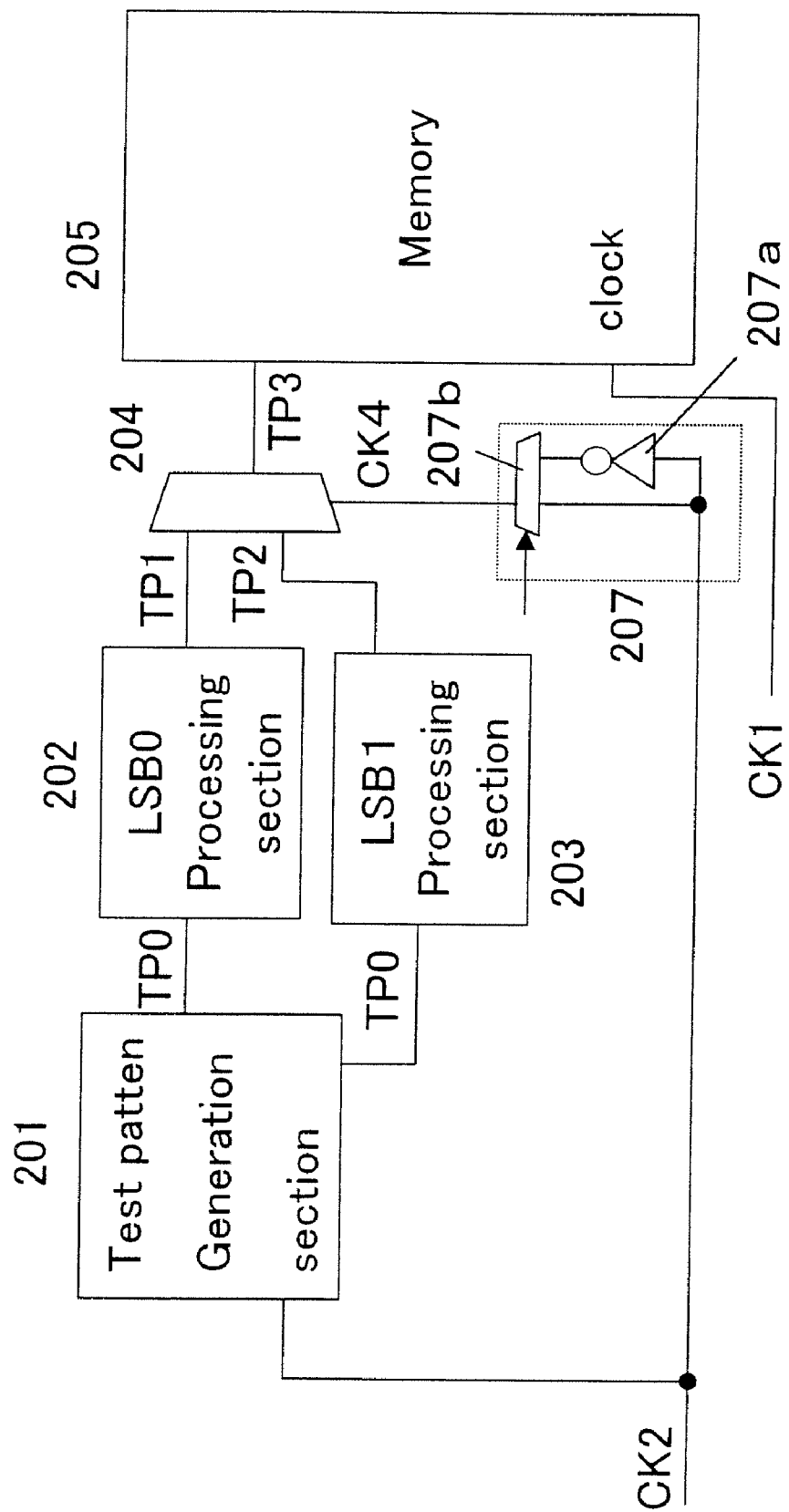
FIG. 13 is a block diagram showing the configuration of a semiconductor integrated circuit in accordance with a fourth embodiment of the present invention.
Figure 14:
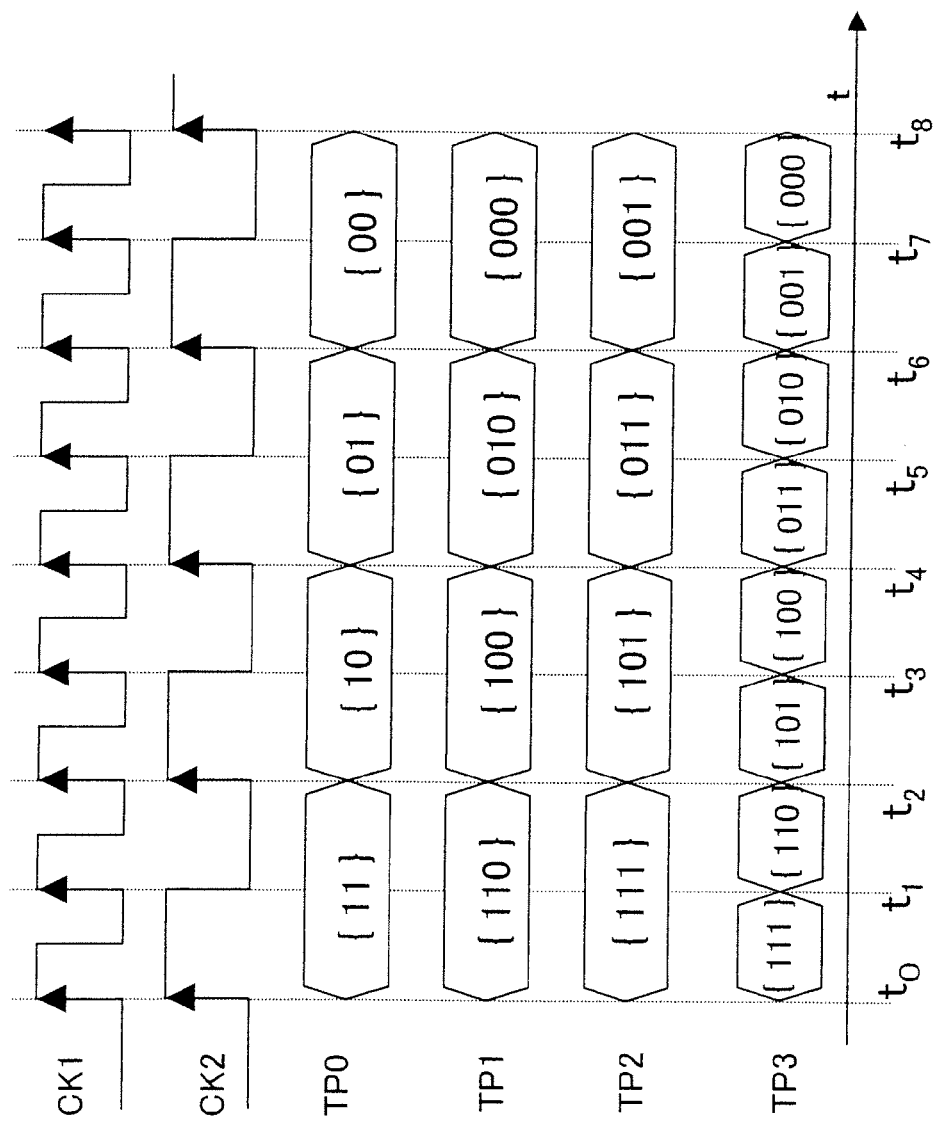
FIG. 14 is a timing chart illustrating the operation of the semiconductor integrated circuit in accordance with the fourth embodiment of the present invention.

FIG. 13 is a block diagram illustrating a semiconductor integrated circuit and a memory test method in accordance with a fourth embodiment of the present invention, and FIG. 14 is a timing chart.

The memory test method in the semiconductor integrated circuit shown in FIG. 13 will be described below on the basis of the flowchart of FIG. 7.

The semiconductor integrated circuit differs from the semiconductor integrated circuit shown in FIG. 4 in that the circuit is equipped with a clock selection section 207.

The clock selection section 207 is a circuit that selects the second clock CK2 or the inverted signal of the second clock CK2 and outputs the selected clock signal as a clock CK4. The test data selection section 204 selects either the address signal TP1 generated by the LSB0 processing section 202 or the address signal TP2 generated by the LSB1 processing section 203 depending on the signal value of the clock CK4 output from the clock selection section 207.

The case wherein the inverted signal of the clock CK2 is selected by the clock selection section 207 will be described below.

The first clock CK1 is a clock signal for the memory 205 operating in synchronization with the rising edge of the clock being input thereto. The second clock CK2 is a clock signal for the test pattern generation section 201 operating in synchronization with the rising edge of the clock being input thereto, and its frequency is half the frequency of the first clock CK1.

At the test pattern generation processing step ST301, an address signal TP0 is generated by the test pattern generation section 201 in synchronization with the rising edge of the clock CK2. More specifically, {11} is generated as the address signal TP0 at time t0, {10} is generated as the address signal TP0 at time t2, {01} is generated as the address signal TP0 at time t4, and {00} is generated as the address signal TP0 at time t6.

At the LSB processing step ST302, numeric value 0 or 1 is added to the address signal TP0 generated by the test pattern generation section 201 as the least significant bit thereof. In the LSB0 processing section 202, numeric value 0 is added to the address signal TP0 as the least significant bit thereof, thereby generating the address signal TP1. Furthermore, in the LSB1 processing section 203, numeric value 1 is added to the address signal TP0 as the least significant bit thereof, thereby generating the address signal TP2.

As shown in the timing chart of FIG. 14, at time t0, numeric value 0 is added as the least significant bit to the two-bit address {11} generated as the address signal TP0 in the LSB0 processing section 202, whereby a three-bit address {110} is generated as the address signal TP1. In addition, numeric value 1 is added as the least significant bit to the address signal TP0 in the LSB1 processing section 203, whereby a three-bit address {111} is generated as the address signal TP2.

At time t2, numeric value 0 is added as the least significant bit to the two-bit address {10} generated as the address signal TP0 in the LSB0 processing section 202, whereby a three-bit address {100} is generated as the address signal TP1. In addition, numeric value 1 is added as the least significant bit to the address signal TP0 in the LSB1 processing section 203, whereby a three-bit address {101} is generated as the address signal TP2.

At time t4, numeric value 0 is added as the least significant bit to the two-bit address {01} generated as the address signal TP0 in the LSB0 processing section 202, whereby a three-bit address {010} is generated as the address signal TP1. In addition, numeric value 1 is added as the least significant bit to the address signal TP0 in the LSB1 processing section 203, whereby a three-bit address {011} is generated as the address signal TP2.

At time t6, numeric value 0 is added as the least significant bit to the two-bit address {00} generated as the address signal TP0 in the LSB0 processing section 202, whereby a three-bit address {000} is generated as the address signal TP1. In addition, numeric value 1 is added as the least significant bit to the address signal TP0 in the LSB1 processing section 203, whereby a three-bit address {001} is generated as the address signal TP2.

The clock selection section 207 selects the clock CK2 or the inverted signal of the clock CK2 and outputs the selected clock signal as the clock CK4. The test data selection section 204 selects either the address signal TP1 generated by the LSB0 processing section 202 or the address signal TP2 generated by the LSB1 processing section 203 depending on the signal value of the clock CK4 output from the clock selection section 207.

In other words, at the test data selection processing step ST303, either the address signal TP1 generated by the LSB0 processing section 202 or the address signal TP2 generated by the LSB1 processing section 203 is selectively output depending on the signal value of the clock CK4 of the clock selection section 207.

The test data selection section 204 selects the address signal TP1 when the clock CK4 has logical value 1, and selects the address signal TP2 when the clock CK4 has logical value 0.

In the case when the inverted signal of the clock CK2 is selected as the output clock CK4 of the clock selection section 207 and in the period from time t0 to time t1 in which the logical value of the clock CK2 is 1, that is, the logical value of the clock CK4 is 0, the test data selection section 204 outputs {111} as the address signal TP3. In addition, in the period from time t1 to time t2 in which the logical value of the clock CK2 is 0, that is, the logical value of the clock CK4 is 1, the test data selection section 204 outputs {110} as the address signal TP3.

In the period from time t2 to time t3 in which the logical value of the clock CK2 is 1, that is, the logical value of the clock CK4 is 0, the test data selection section 204 generates {101} as the address signal TP3. In addition, in the period from time t3 to time t4 in which the logical value of the clock CK2 is 0, that is, the logical value of the clock CK4 is 1, the test data selection section 204 generates {100} as the address signal TP3.

In the period from time t4 to time t5 in which the logical value of the clock CK2 is 1, that is, the logical value of the clock CK4 is 0, the test data selection section 204 generates {011} as the address signal TP3. In addition, in the period from time t5 to time t6 in which the logical value of the clock CK2 is 0, that is, the logical value of the clock CK4 is 1, the test data selection section 204 generates {010} as the address signal TP3.

In the period from time t6 to time t7 in which the logical value of the second clock CK2 is 1, that is, the logical value of the clock CK4 is 0, the test data selection section 204 outputs {001} as the address signal TP3. In addition, in the period from time t7 to time t8 in which the logical value of the clock CK2 is 0, that is, the logical value of the clock CK4 is 1, the test data selection section 204 outputs {000} as the address signal TP3.

At the test pattern application processing step ST304, the address signal TP3 output from the test data selection section 204 is applied to the memory 205.

As described above, in this embodiment, by the single test pattern generation section 201 operating on the clock CK2, a test pattern can be applied at the actual operation speed of the memory 205 to the memory 205 operating at double the frequency of the test pattern generation section 201. The other effects are similar to those of the second embodiment.

Figure 16:
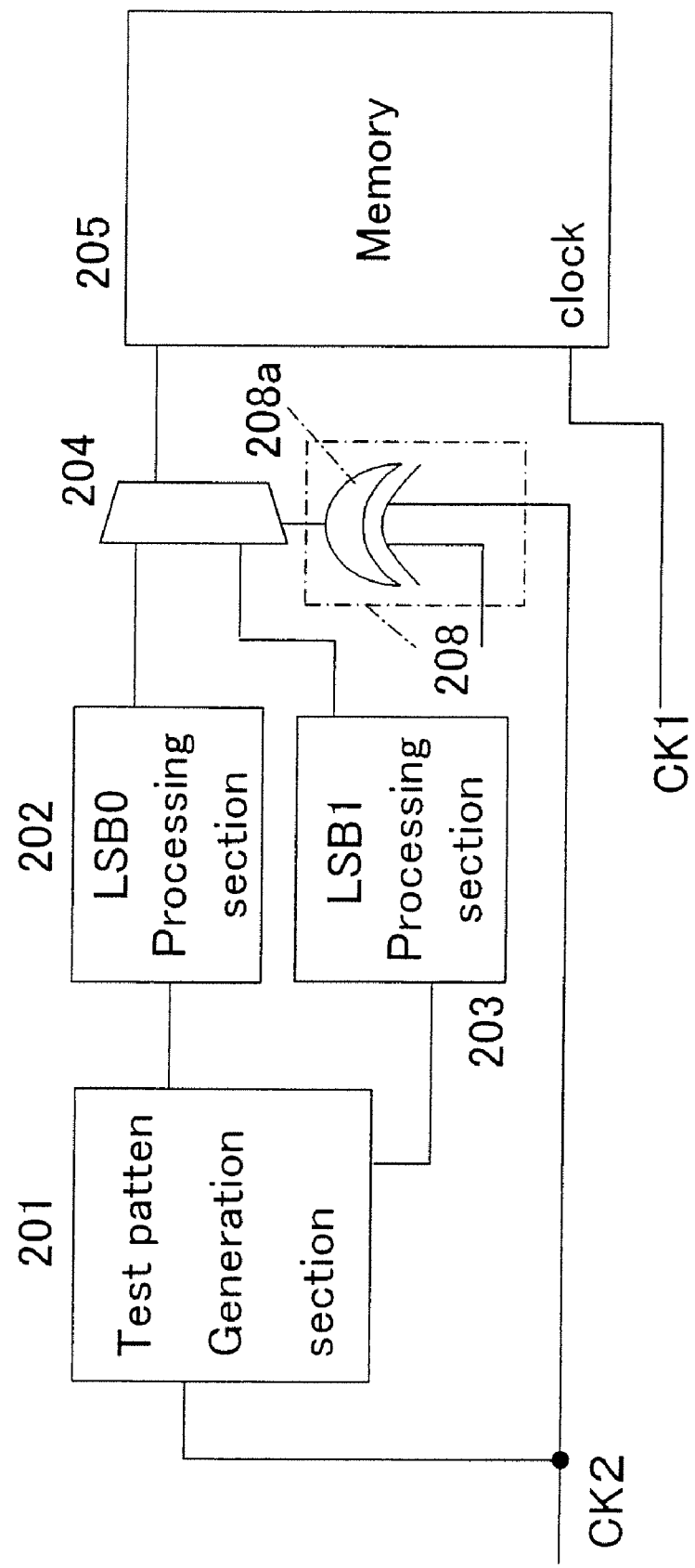
FIG. 16 is a block diagram showing another configuration of the clock selection section of the semiconductor integrated circuit in accordance with the fourth embodiment of the present invention.

Furthermore, in this embodiment, a circuit wherein the clock CK2 or the signal obtained by inverting the clock CK2 using an inverter 207a is selected by a selector 207b is used as the clock selection section 207. However, even when a circuit capable of selectively outputting either the clock CK2 or the inverted signal of the clock CK2, formed of an exclusive OR circuit 208a as shown in FIG. 16, is used as a clock selection section 208 instead of the clock selection section 207, effects similar to those of this embodiment can be obtained.

By providing the clock selection section 207 or 208, the test data selection section 204 can switch between the signal selected when the logical value of the clock CK2 is 0 and the signal selected when the logical value of the clock CK2 is 1. Hence, it is possible to obtain not only a configuration wherein an even-numbered address is applied to the memory 205 when the logical value of the clock CK2 is 1 and an odd-numbered address is applied to the memory 205 when the logical value of the clock CK2 is 0, but also a configuration wherein an odd-numbered address is applied to the memory 205 when the logical value of the clock CK2 is 1 and an even-numbered address is applied to the memory 205 when the logical value of the clock CK2 is 0. Therefore, the quality of the test pattern is raised, and address increment and decrement can be carried out.

The quality of the test pattern is explained below. In actual operation, when the clock CK2 is high (this corresponds to the high state of the clock CK1 in the case of a double data rate memory), both even-numbered and odd-numbered addresses should be able to be accessed. However, if only the even-numbered addresses can be accessed when the clock CK2 is high during a test, it is impossible to say that this test is a high-quality test. Since the odd-numbered addresses cannot be accessed when the clock CK2 is high, it is said that the quality of the test pattern is low. However, since the test can be carried out by using both the even-numbered and odd-numbered addresses in the case of this embodiment, it is said that the quality of the test pattern is raised.

Figure 15:
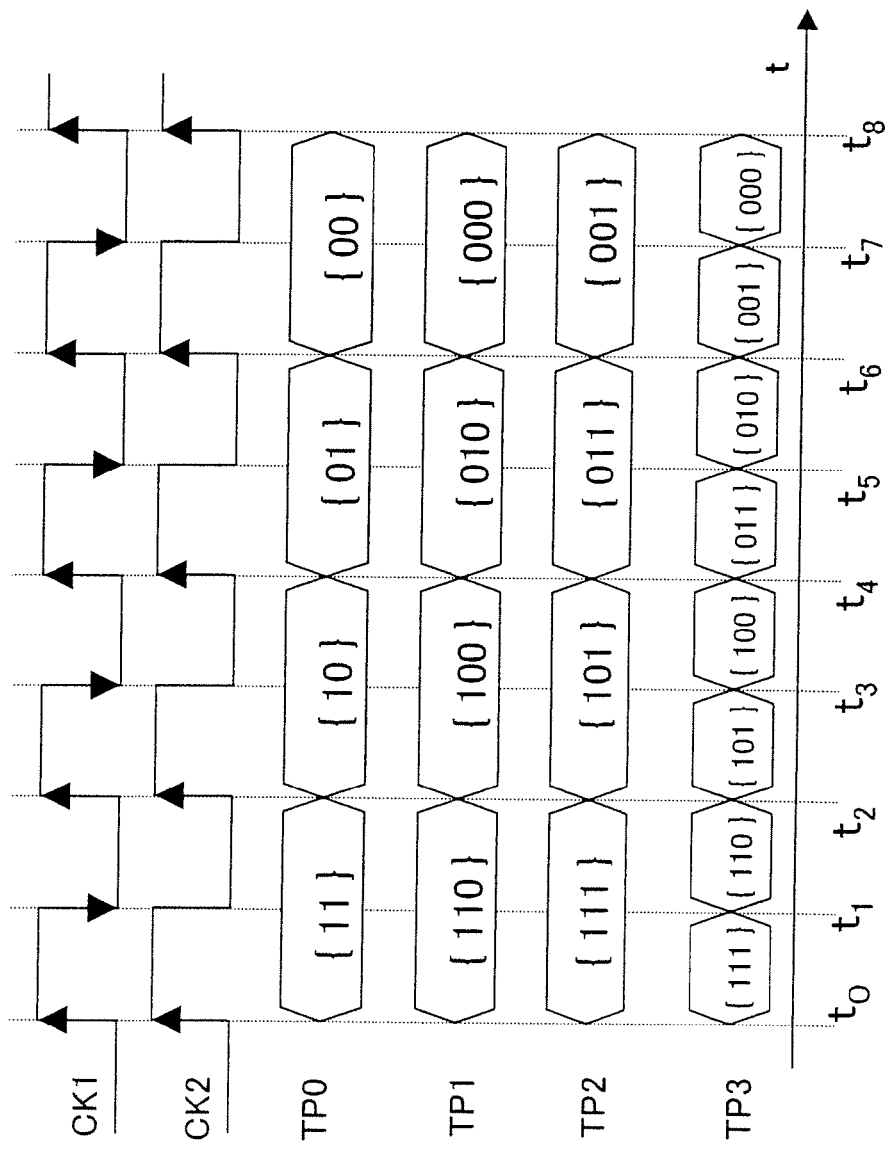
FIG. 15 is a timing chart illustrating the operation of the semiconductor integrated circuit in accordance with the fourth embodiment of the present invention.

In the case when the memory 205 is a DDR memory, as shown in the timing chart of FIG. 15, by inputting clock signals, having the same frequency, as the clock CK1 supplied to the DDR memory and the clock CK2 supplied to the BIST circuit, a test pattern can be input in synchronization with both the rising and falling edges of the clock CK1 of the DDR memory, whereby effects similar to those of this embodiment can be obtained.

Fifth Embodiment

Figure 17:
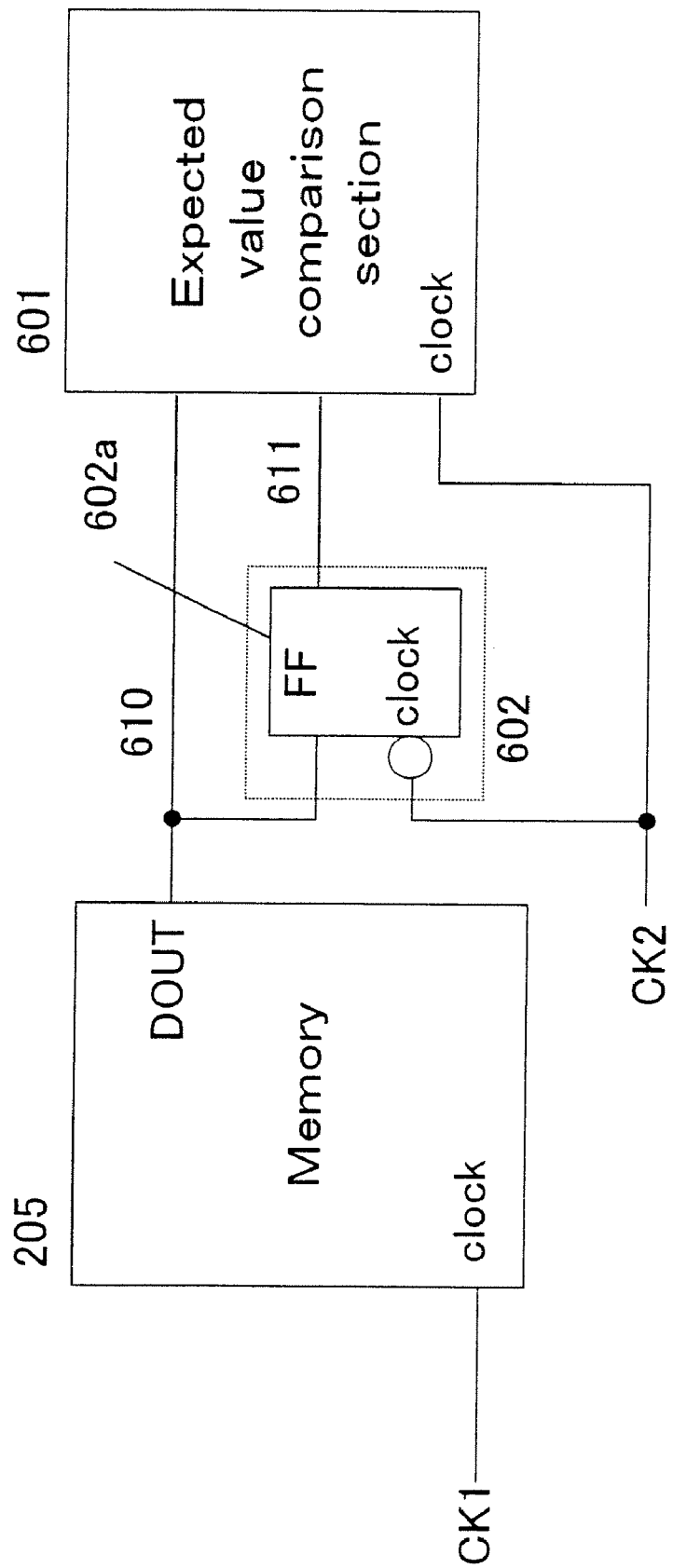
FIG. 17 is a block diagram showing the configuration of a semiconductor integrated circuit in accordance with a fifth embodiment of the present invention.
Figure 18:
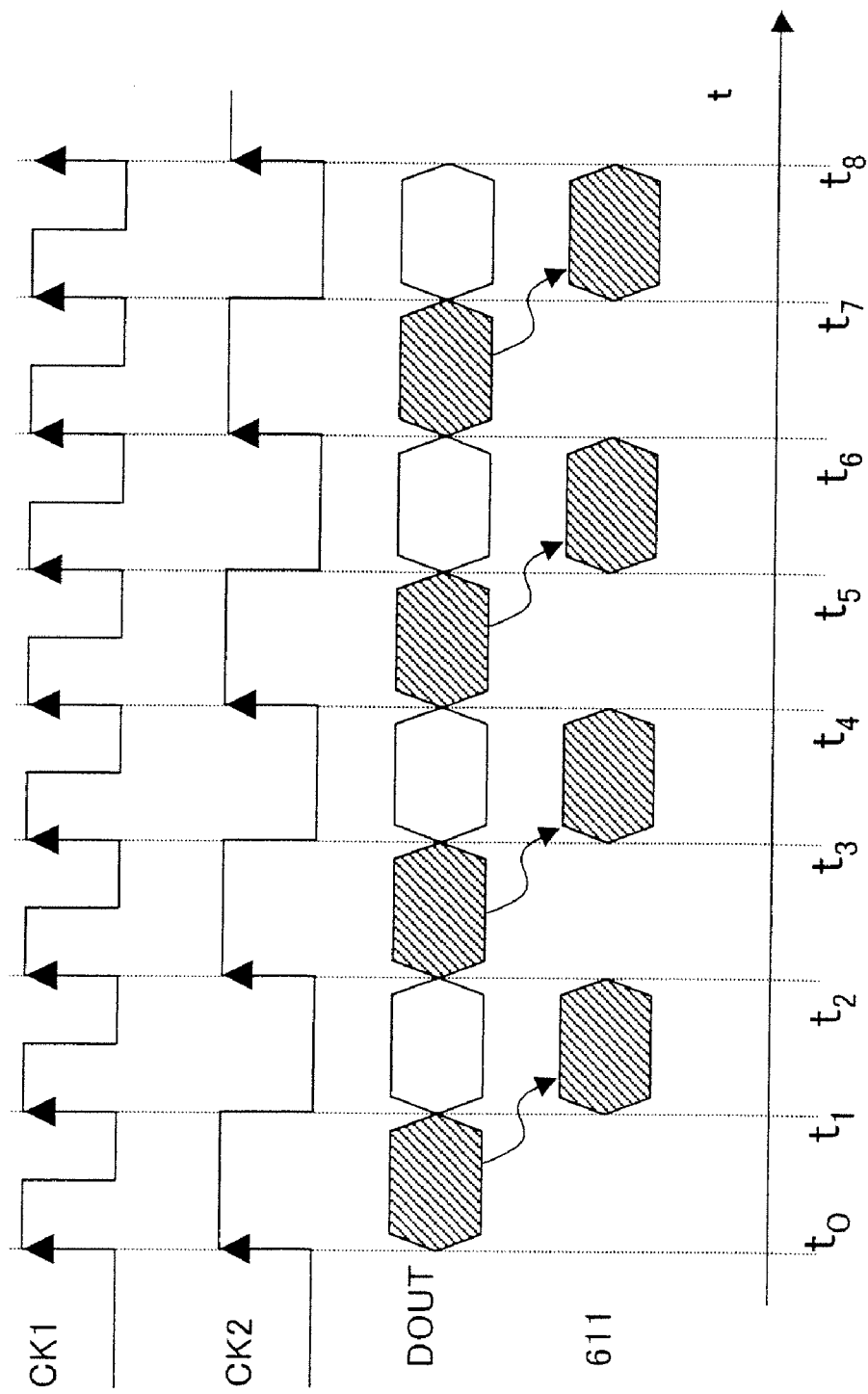
FIG. 18 is a timing chart illustrating the operation of the semiconductor integrated circuit in accordance with the fifth embodiment of the present invention.

FIG. 17 is a block diagram illustrating a semiconductor integrated circuit and a memory test method in accordance with a fifth embodiment of the present invention, and FIG. 18 is a timing chart.

Figure 20:
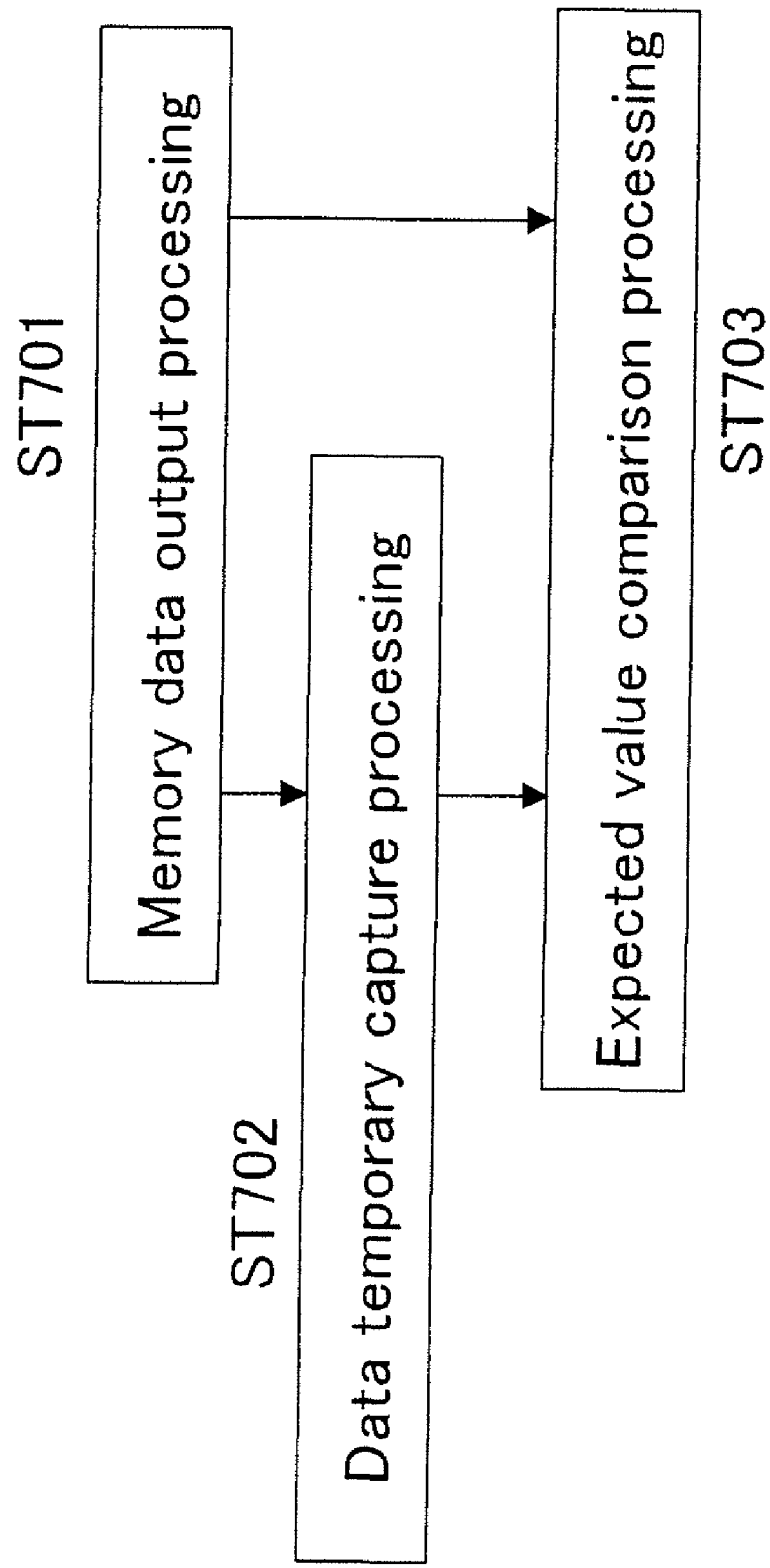
FIG. 20 is a flowchart showing a method of testing a memory in accordance with the fifth embodiment of the present invention.
Figure 21:
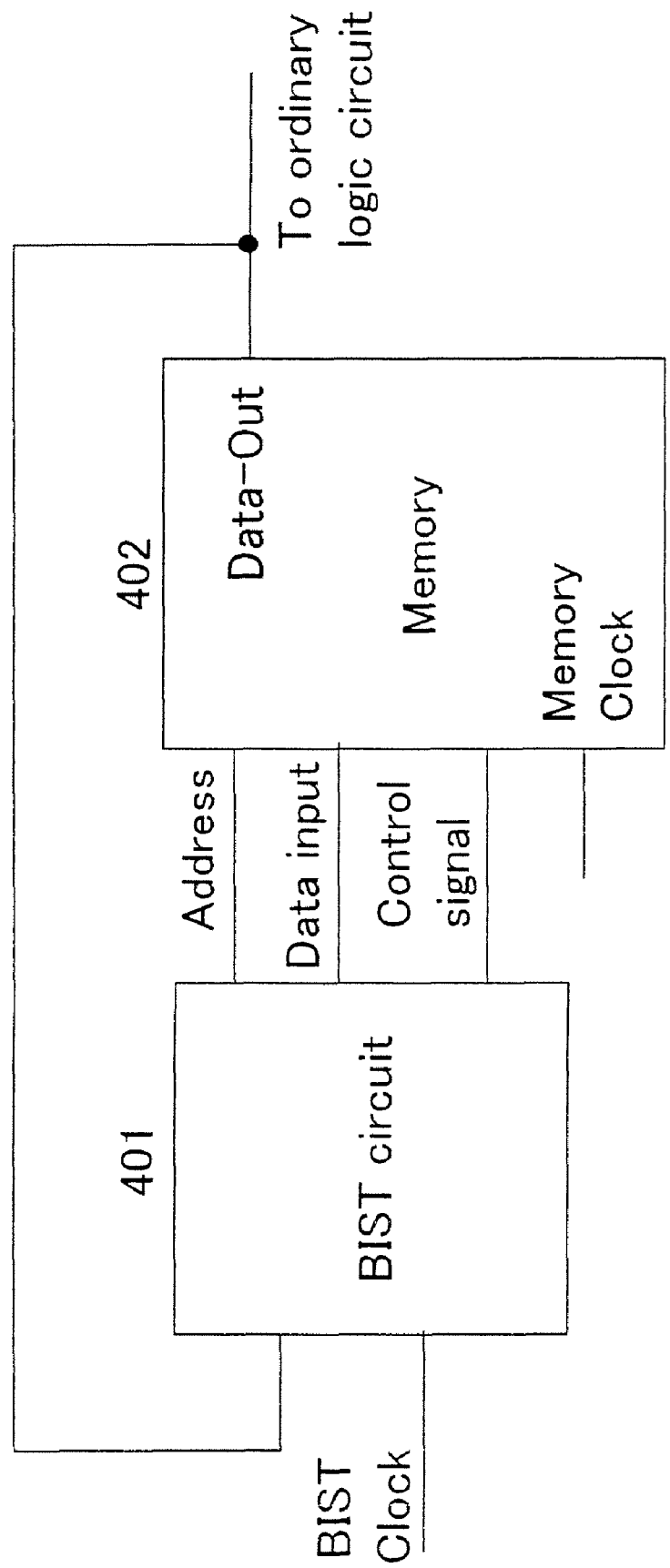
FIG. 21 is a block diagram showing the prior art.
Figure 22:
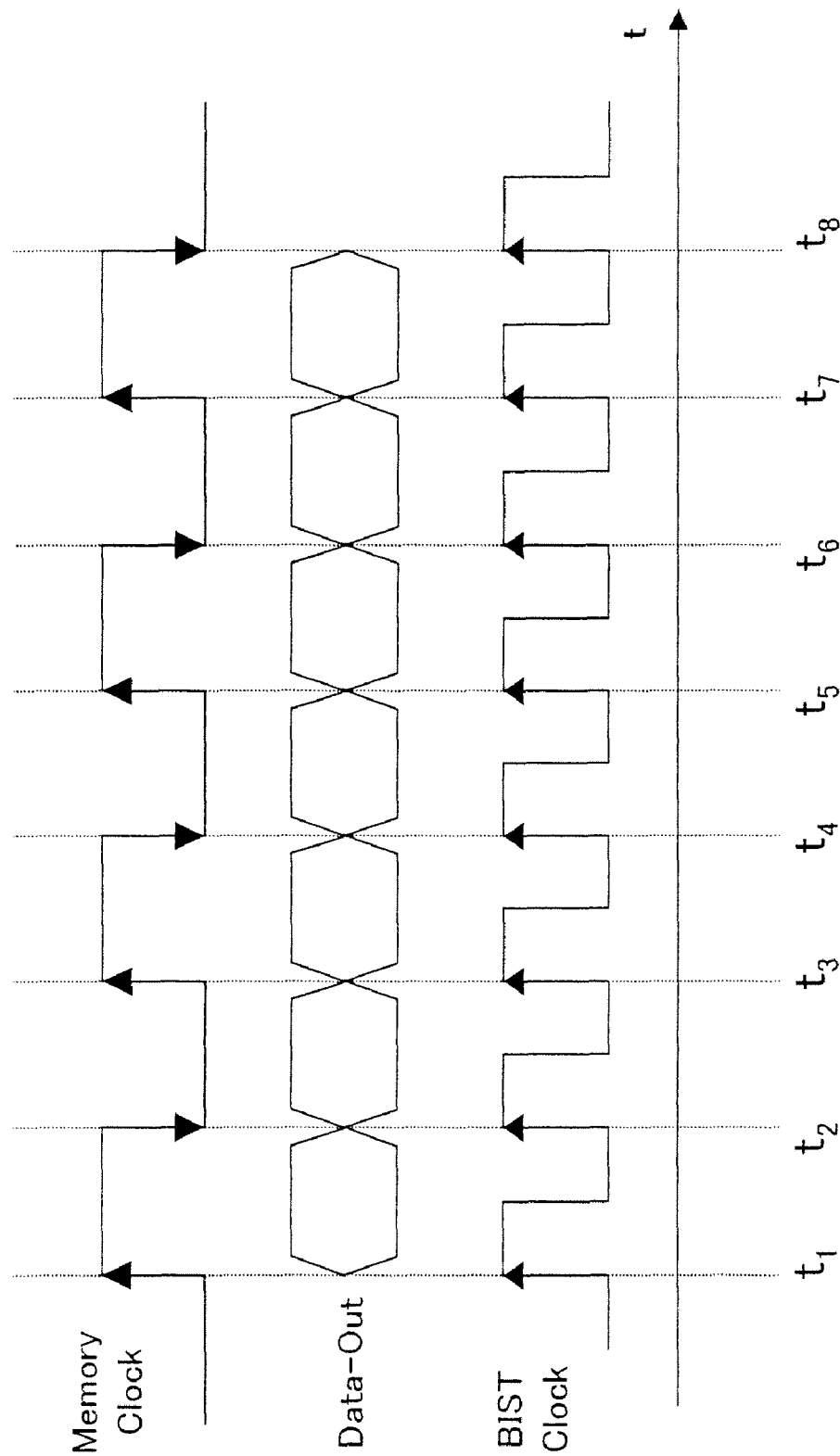
FIG. 22 is a timing chart illustrating the operation of the prior art.

The memory test method in the semiconductor integrated circuit shown in FIG. 17 will be described below on the basis of the flowchart of FIG. 20.

In FIG. 17, numeral 205 designates a memory operating in synchronization with the rising edge of an input clock. Numeral 601 designates an expected value comparison section operating in synchronization with the rising edge of an input clock. Numeral 602 designates a memory device operating in synchronization with the falling edge of the input clock for the expected value comparison section 601. This memory device 602 is formed of a flip-flop 602a, for example.

The first clock CK1 is the clock signal for the memory 205. The second clock CK2 is the clock signal for the expected value comparison section 601 and the memory device 602, and its frequency is half the frequency of the clock CK1.

At memory data output processing step ST701, a data signal 610 is output from the data output port DOUT of the memory 205 in synchronization with the rising edge of the clock CK1 at times t0, t1, t2, t3, t4, t5, t6, t7 and t8.

The data 610 output from the memory 205 in synchronization with the rising edge of the clock CK1 at time t0 is captured by the flip-flop 602a in synchronization with the falling edge of the clock CK2 at time t1 at data temporary capture processing step ST702. Then, at expected value comparison processing step ST703, the data enters the expected value comparison section 601 as a data signal 611 and is compared with an expected value at time t2.

In addition, the data output from the memory 205 in synchronization with the rising edge of the clock CK1 at time t1 enters the expected value comparison section 601 as the data signal 610 and is compared with the expected value at time t2.

Similarly, the data output from the memory 205 in synchronization with the rising edge of the clock CK1 at time t2 is captured by the flip-flop 602a in synchronization with the falling edge of the clock CK2 at time t3 at the data temporary capture processing step ST702. Then, the data enters the expected value comparison section 601 as the data signal 611 and is compared with the expected value at time t4.

In addition, the data output from the memory 205 in synchronization with the rising edge of the clock CK1 at time t3 enters the expected value comparison section 601 as the data signal 610 and is compared with the expected value at time t4 at the expected value comparison processing step ST703.

The data output from the memory 205 in synchronization with the rising edge of the clock CK1 at time t4 is captured by the flip-flop 602a in synchronization with the falling edge of the clock CK2 at time t5 at the data temporary capture processing step ST702. Then, the data enters the expected value comparison section 601 as the data signal 611 and is compared with the expected value at time t6.

In addition, the data output from the memory 205 in synchronization with the rising edge of the clock CK1 at time t5 enters the expected value comparison section 601 as the data signal 610 and is compared with the expected value at time t6 at the expected value comparison processing step ST703.

The data output from the memory 205 in synchronization with the rising edge of the clock CK1 at time t6 is captured by the flip-flop 602a in synchronization with the falling edge of the clock CK2 at time t7 at the data temporary capture processing step ST702. Then, the data enters the expected value comparison section 601 as the data signal 611 and is compared with the expected value at time t8.

In addition, the data output from the memory 205 in synchronization with the rising edge of the clock CK1 at time t7 enters the expected value comparison section 601 as the data signal 610 and is compared with the expected value at time t8 at the expected value comparison processing step ST703.

As described above, in this embodiment, the comparison with the expected value at the expected value comparison processing step ST703 is carried out only at the rising edge of the clock CK2. A test pattern can thus be applied at the actual operation speed of the memory 205 to the memory 205 operating at double the operation frequency of the expected value comparison section 601, without changing the operation speed of the expected value comparison section 601.

In this embodiment, the flip-flop operating at the falling edge of the clock CK2 is used as the memory device 602. However, even if a latch wherein data passes through in the high-level period of the clock CK2 is used, effects similar to those of this embodiment can be obtained.

Figure 19:
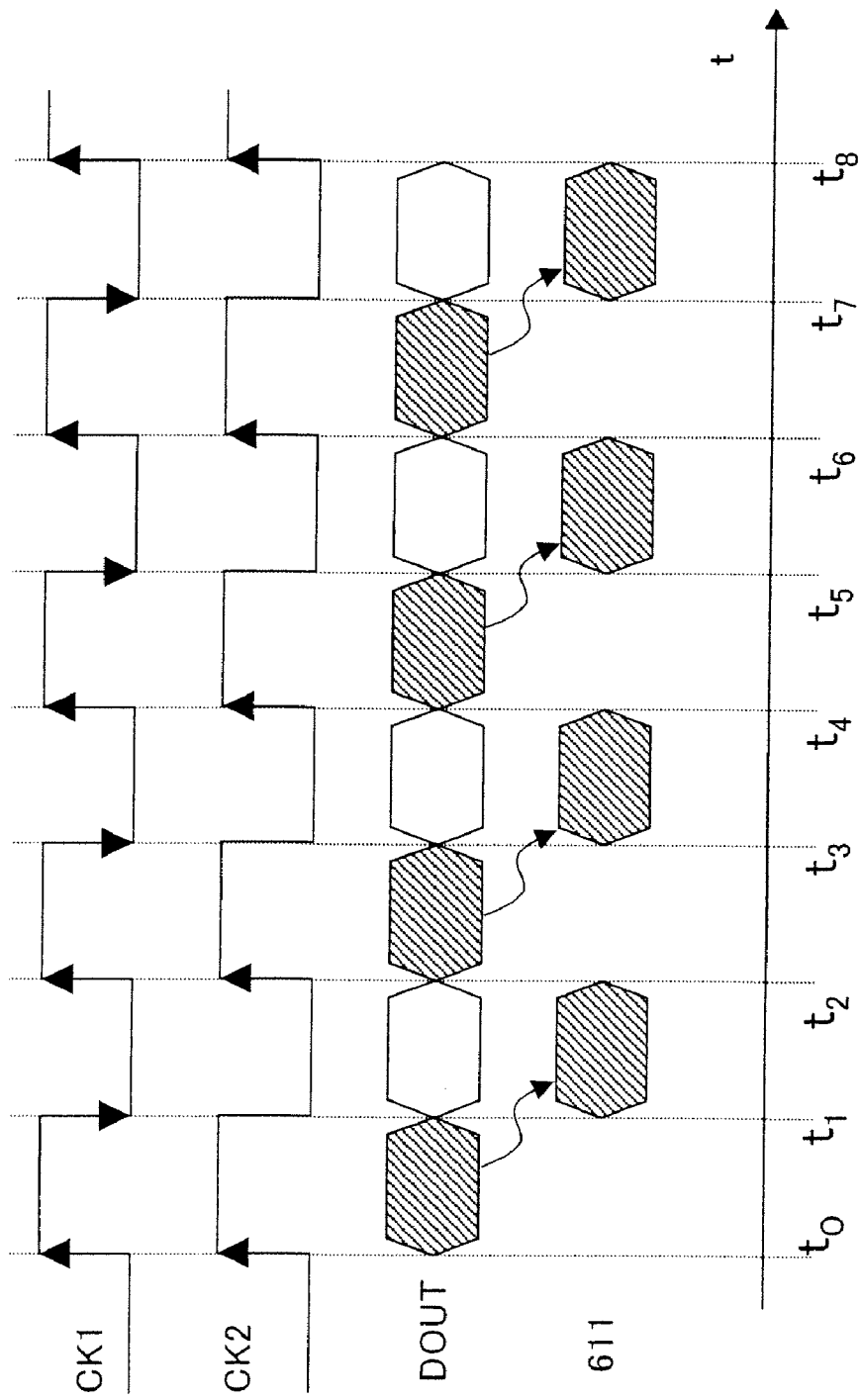
FIG. 19 is a timing chart illustrating the operation of the semiconductor integrated circuit in accordance with the fifth embodiment of the present invention.

In the case when the memory 205 is a DDR memory, as shown in the timing chart of FIG. 19, by inputting clock signals, having the same frequency, as the clock CK1 supplied to the DDR memory and the clock CK2 supplied to the BIST circuit, and only by comparing the memory 205's data signal output in synchronization with both the rising and falling edges of the clock signal CK1 of the DDR memory with the expected value at the rising timing of the clock CK2, effects similar to those of this embodiment can be obtained.

As described above, in the semiconductor integrated circuit and the memory test method in accordance with the above-mentioned embodiments of the present invention, by switching the input data depending on the logical value of the clock of the BIST circuit, a test pattern can be applied at the actual operation speed of the memory 205, even when the BIST circuit operates at half the clock frequency of the memory 205.

In addition, in the comparison with the expected value, the data output from the memory 205 is held by the memory device 602 and compared with the expected value together with the data to be output next, whereby the comparison with the expected value can be carried out at the actual operation speed of the memory by using the expected value comparison section 601 operating at half the clock frequency of the memory.

Furthermore, also in the case of a high-speed memory, such as a DDR memory, operating in synchronization with both the rising and falling edges of the clock, the DDR memory can be tested at its actual operation speed by operating the BIST circuit at the same clock frequency as that of the DDR memory.

Sixth Embodiment

Figure 23:
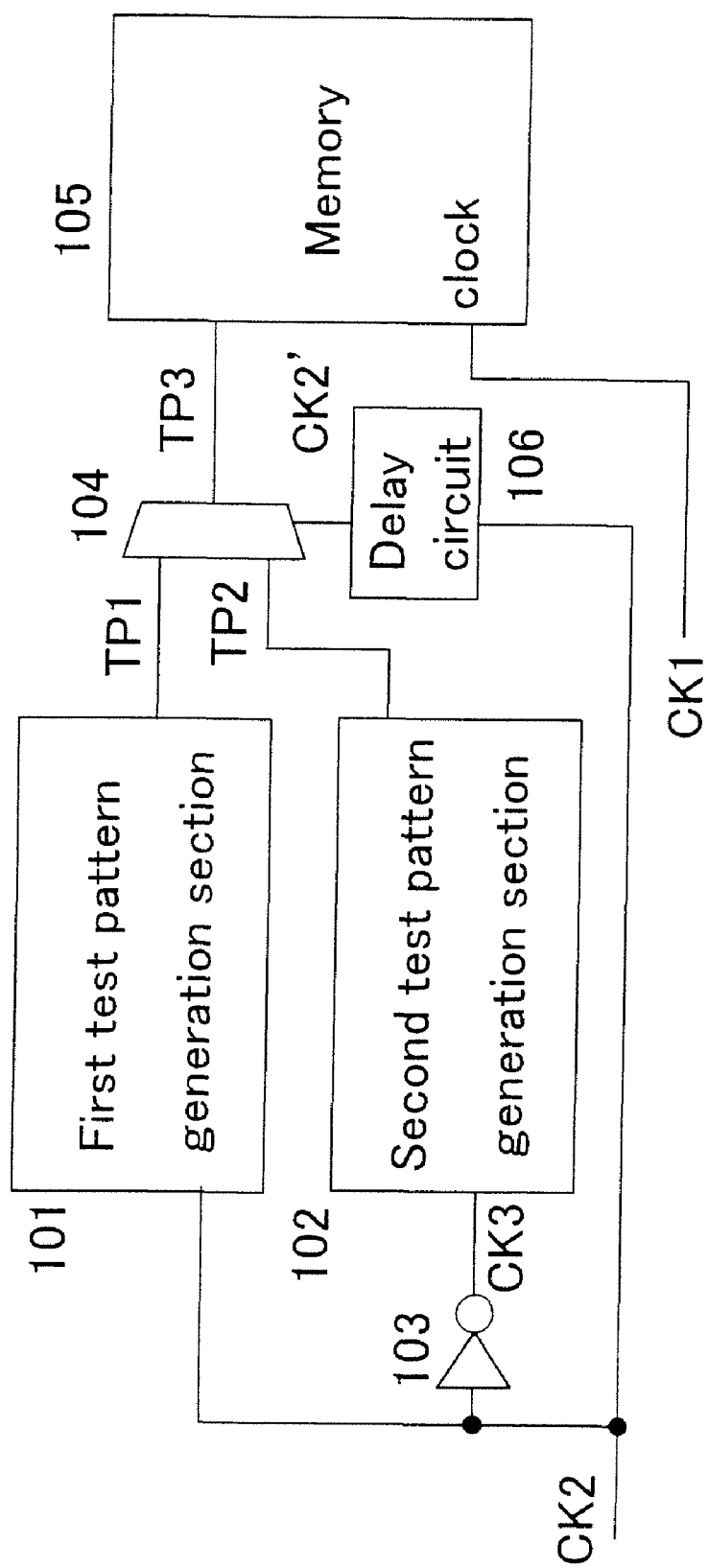
FIG. 23 is a block diagram showing the configuration of a semiconductor integrated circuit in accordance with a sixth embodiment of the present invention.

FIG. 23 is a block diagram illustrating a semiconductor integrated circuit and a memory test method in accordance with a sixth embodiment of the present invention.

The semiconductor integrated circuit differs from the semiconductor integrated circuit shown in FIG. 1 in that the circuit is equipped with a delay circuit 106 for generating a delay clock CK2' obtained by delaying the second clock CK2. The configuration and the operation of this delay circuit 106 are similar to those of the delay circuit 206 in accordance with the third embodiment. Since the delay circuit 106 is provided, operations and effects similar to those of the third embodiment can be obtained.

Figure 24:
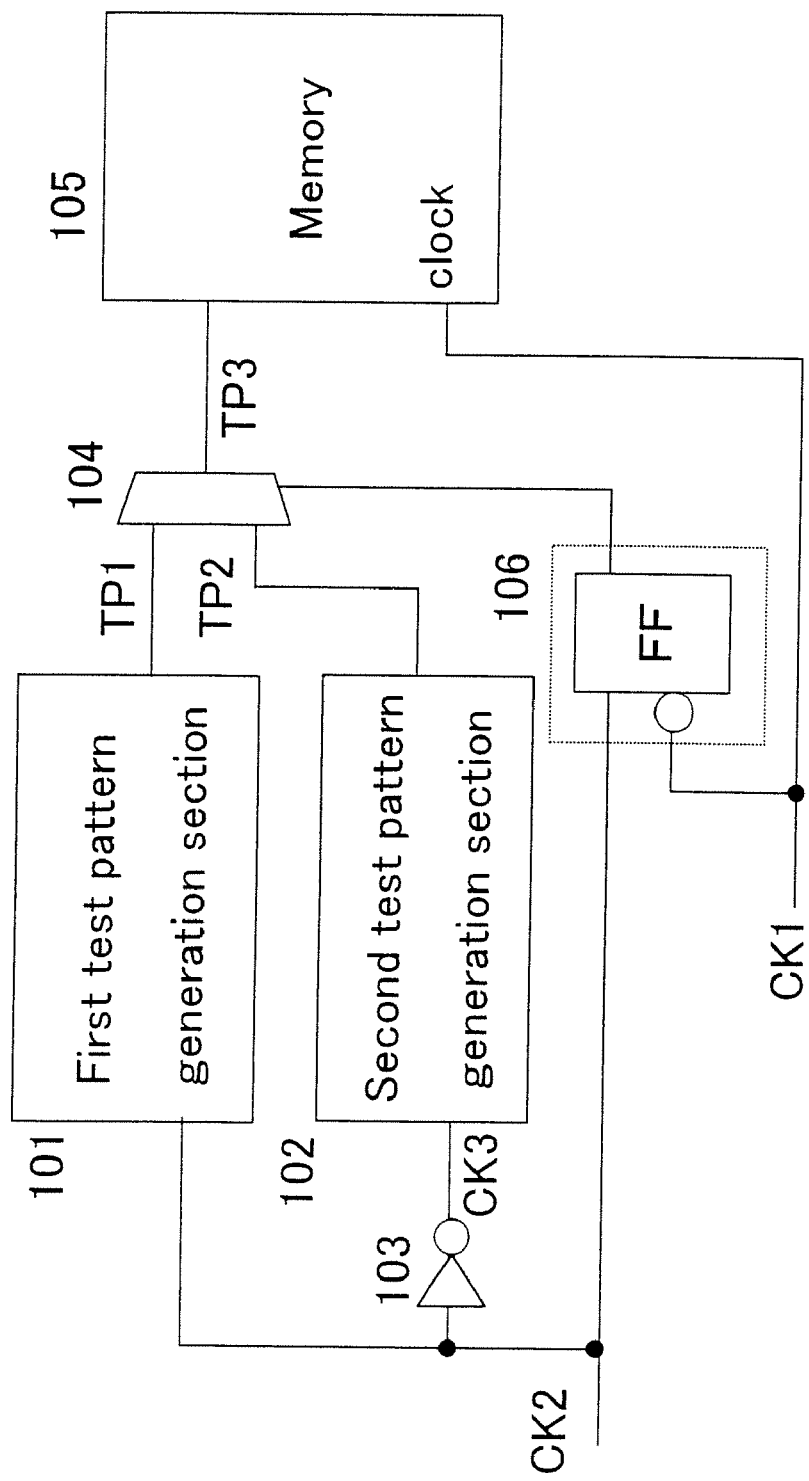
FIG. 24 is a block diagram showing a first specific example of a delay circuit for the semiconductor integrated circuit in accordance with the sixth embodiment of the present invention.
Figure 25:
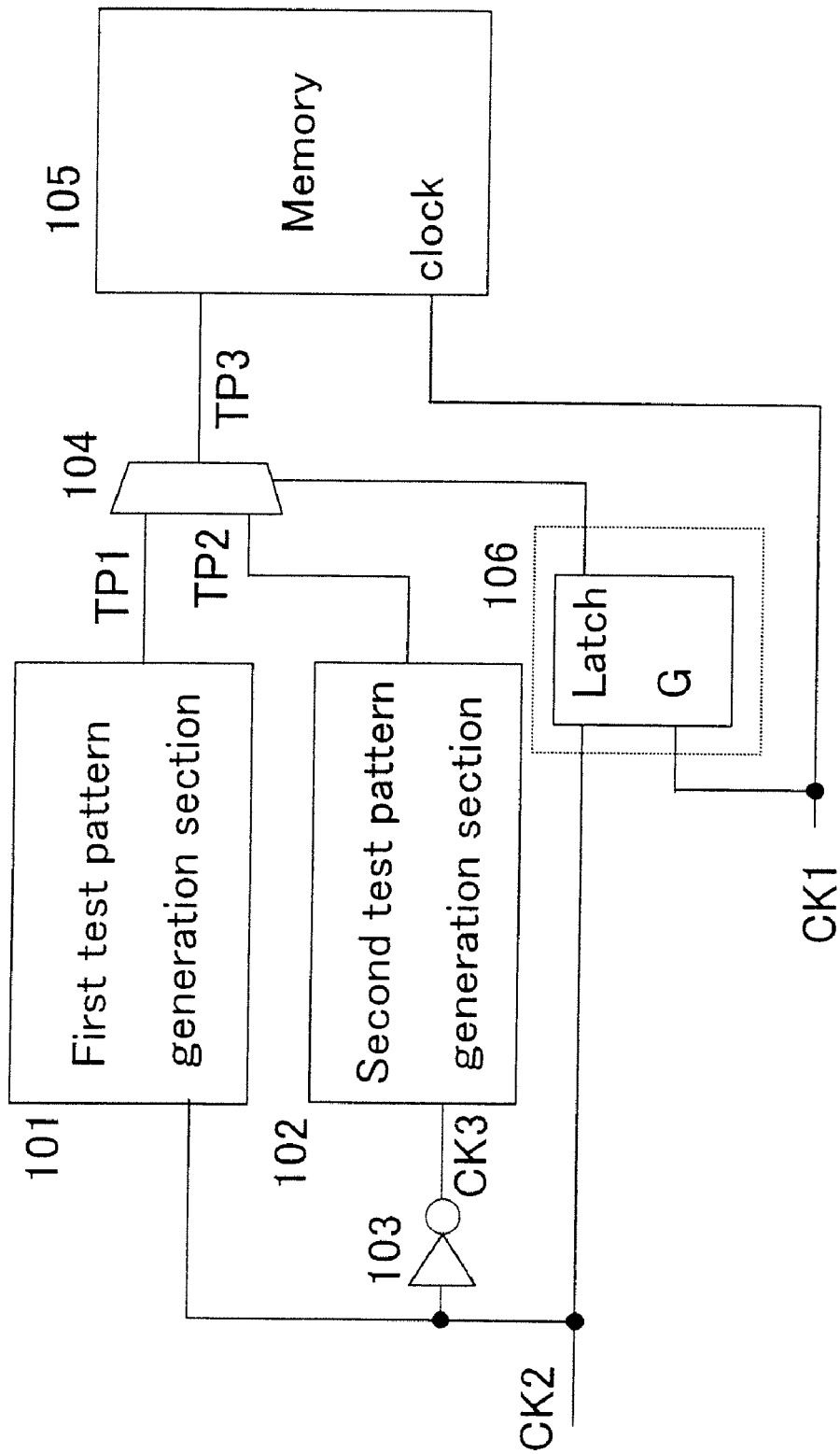
FIG. 25 is a block diagram showing a second specific example of a delay circuit for the semiconductor integrated circuit in accordance with the sixth embodiment of the present invention.

A specific example of the delay circuit 106 is similar to that explained in the third embodiment and is shown in FIG. 24 or FIG. 25.

Seventh Embodiment

Figure 26:
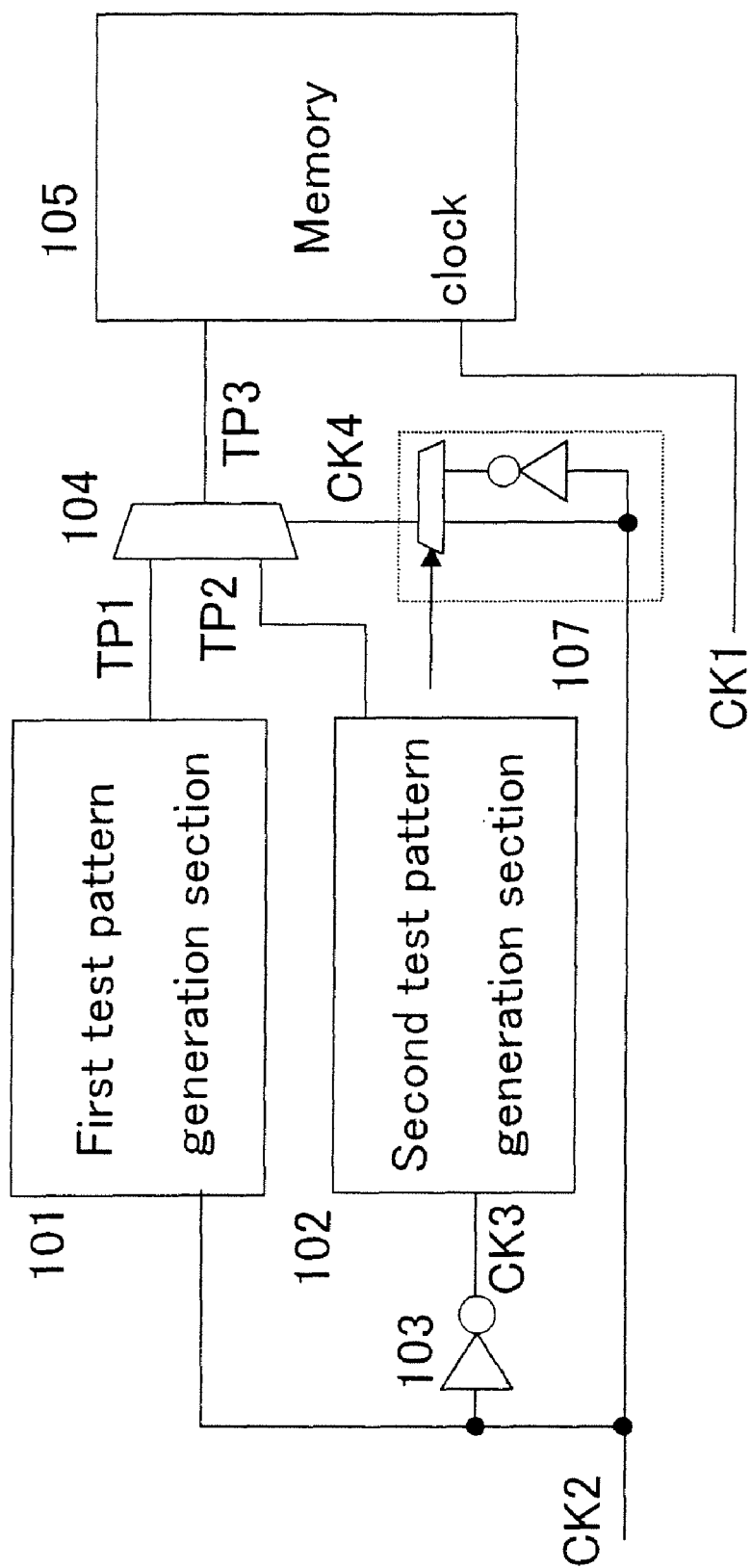
FIG. 26 is a block diagram showing the configuration of a semiconductor integrated circuit in accordance with a seventh embodiment of the present invention.

FIG. 26 is a block diagram illustrating a semiconductor integrated circuit and a memory test method in accordance with a seventh embodiment of the present invention.

The semiconductor integrated circuit differs from the semiconductor integrated circuit shown in FIG. 1 in that the circuit is equipped with a clock selection section 107. The configuration and the operation of the clock selection section 107 are similar to those of the clock selection section 207 in accordance with the fourth embodiment. Since the clock selection section 107 is provided, operations and effects similar to those of the fourth embodiment can be obtained.

Figure 27:
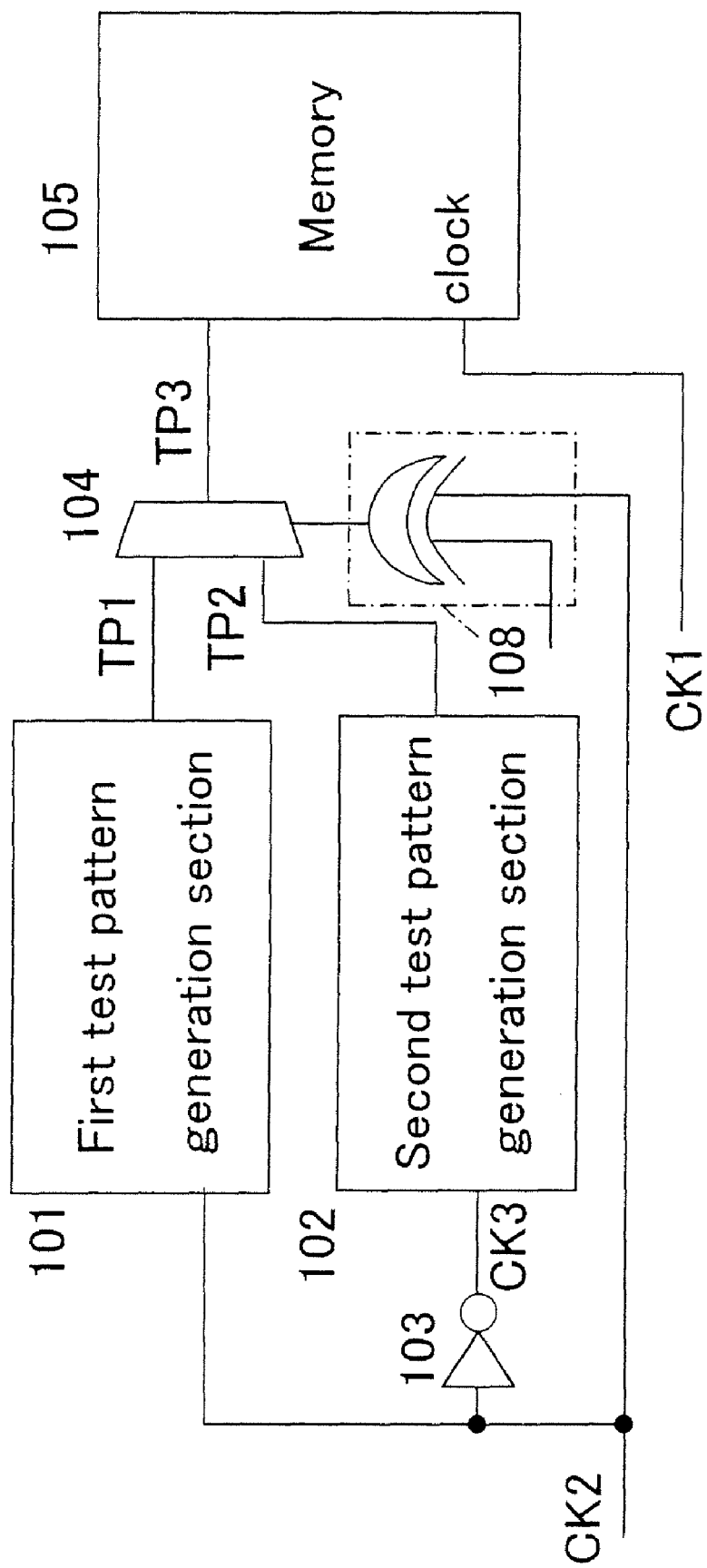
FIG. 27 is a block diagram showing another configuration of the clock selection section of the semiconductor integrated circuit in accordance with the seventh embodiment of the present invention.

Instead of the clock selection section 107, a clock selection section 108 shown in FIG. 27 may be used. This clock selection section 108 is the same as that explained in the fourth embodiment.

The invention claimed is:

1. A semiconductor integrated circuit comprising:
a memory operating on a first clock,
a test pattern generation section, operating on a second clock having half the frequency of said first clock, for generating first test data,
an LSB0 processing section for generating second test data by adding numeric value 0 to said first test data generated by said test pattern generation section as the least significant bit thereof,
an LSB1 processing section for generating third test data by adding numeric value 1 to said first test data generated by said test pattern generation section as the least significant bit thereof,
a test data selection section for selectively outputting either said second or third test data being output from said LSB0 processing section or said LSB1 processing section, respectively, depending on the signal value of said second clock, thereby inputting the selected test data to said memory as fourth test data, and
a delay circuit for generating a delay clock obtained by delaying said second clock and for supplying said delay clock to said test data selection section.

2. A semiconductor integrated circuit comprising:
a memory operating on a first clock,
a test pattern generation section, operating on a second clock having half the frequency of said first clock, for generating first test data,
an LSB0 processing section for generating second test data by adding numeric value 0 to said first test data generated by said test pattern generation section as the least significant bit thereof,
an LSB1 processing section for generating third test data by adding numeric value 1 to said first test data generated by said test pattern generation section as the least significant bit thereof,
a clock selection section capable of selecting either said second clock or the inverted clock of said second clock, and
a test data selection section for selectively outputting either said second or third test data being output from said LSB0 processing section or said LSB1 processing section, respectively, depending on the output of said clock selection section, thereby inputting the selected test data to said memory as fourth test data.

3. A semiconductor integrated circuit comprising:
a double data rate memory operating on a first clock,
a test pattern generation section, operating on a second clock having the same frequency as that of said first clock, for generating first test data,
an LSB0 processing section for generating second test data by adding numeric value 0 to said first test data generated by said test pattern generation section as the least significant bit thereof,
an LSB1 processing section for generating third test data by adding numeric value 1 to said first test data generated by said test pattern generation section as the least significant bit thereof, and
a test data selection section for selectively outputting either said second or third test data being output from said LSB0 processing section or said LSB1 processing section, respectively, depending on the signal value of said second clock, thereby inputting the selected test data to said double data rate memory as fourth test data.

4. A semiconductor integrated circuit in accordance with claim 3, wherein a delay circuit for generating a delay clock obtained by delaying said second clock and for supplying said delay clock to said test data selection section is provided.

5. A semiconductor integrated circuit comprising:
a double data rate memory operating on a first clock,
a test pattern generation section, operating on a second clock having the same frequency as that of said first clock, for generating first test data, an LSB0 processing section for generating second test data by adding numeric value 0 to said first test data generated by said test pattern generation section as the least significant bit thereof, an LSB1 processing section for generating third test data by adding numeric value 1 to said first test data generated by said test pattern generation section as the least significant bit thereof, a clock selection section capable of selecting either said second clock or the inverted clock of said second clock, and a test data selection section for selectively outputting either said second or third test data being output from said LSB0 processing section or said LSB1 processing section, respectively, depending on the output of said clock selection section, thereby inputting the selected test data to said double data rate memory as fourth test data.

6. A method of testing a memory operating on a first clock, comprising the steps of holding first data being output from said memory in synchronization with said first clock as second data depending on a second clock having half the frequency of said first clock, and respectively comparing said second data and third data being output in synchronization with said first clock from said memory immediately after the output of said first data with a predetermined expected value depending on said second clock.

7. A method of testing a double data rate memory operating on a first clock, comprising the steps of generating first test data depending on a second clock having the same frequency as that of said first clock, generating second test data by adding numeric value 0 to said first test data as the least significant bit thereof, generating third test data by adding numeric value 1 to said first test data as the least significant bit thereof, selecting either said second or third test data depending on the signal value of said second clock, and inputting the selected test data to said double data rate memory.

8. A method of testing a double data rate memory operating on a first clock, comprising the steps of holding first data being output from said double data rate memory in synchronization with said first clock as second data depending on a second clock having the same frequency as that of said first clock, and respectively comparing said second data and third data being output in synchronization with said first clock from said double data rate memory immediately after the output of said first data with a predetermined expected value depending on said second clock.

9. A semiconductor integrated circuit comprising:
a memory operating on a first clock,
a first test pattern generation section, operating on a second clock having half the frequency of said first clock, for generating first test data,
a second test pattern generation section, operating on a third clock, the inverted clock of said second clock, for generating second test data,
a clock selection section capable of selecting either said second clock or the inverted clock of said second clock, and
a test data selection section for selectively outputting either said first or second test data being output from said first test pattern generation section or said second test pattern generation section, respectively, depending on the output of said clock selection section, thereby inputting the selected test data to said memory as third test data.

10. A semiconductor integrated circuit comprising:
a memory operating on a first clock,
a first test pattern generation section, operating on a second clock having half the frequency of said first clock, for generating first test data,
a second test pattern generation section, operating on said second clock, for generating second test data,
a clock selection section capable of selecting either said second clock or the inverted clock of said second clock, and
a test data selection section for selectively outputting either said first or second test data being output from said first test pattern generation section or said second test pattern generation section, respectively, depending on the output of said clock selection section, thereby inputting the selected test data to said memory as third test data.

11. A semiconductor integrated circuit comprising:
a double data rate memory operating on a first clock,
a first test pattern generation section, operating on a second clock having the same frequency as that of said first clock, for generating first test data,
a second test pattern generation section, operating on a third clock, the inverted clock of said second clock, for generating second test data,
a clock selection section capable of selecting either said second clock or the inverted clock of said second clock, and
a test data selection section for selectively outputting either said first or second test data being output from said first test pattern generation section or said second test pattern generation section, respectively, depending on the output of said clock selection section, thereby inputting the selected test data to said double data rate memory as third test data.

12. A semiconductor integrated circuit comprising:
a double data rate memory operating on a first clock,
a first test pattern generation section, operating on a second clock having the same frequency as that of said first clock, for generating first test data,
a second test pattern generation section, operating on said second clock, for generating second test data,
a clock selection section capable of selecting either said second clock or the inverted clock of said second clock, and
a test data selection section for selectively outputting either said first or second test data being output from said first test pattern generation section or said second test pattern generation section, respectively, depending on the output of said clock selection section, thereby inputting the selected test data to said double data rate memory as third test data.

* * * * *

UNITED STATES PATENT AND TRADEMARK OFFICE
CERTIFICATE OF CORRECTION

PATENT NO. : 7,739,563 B2  Page 1 of 1
APPLICATION NO. : 12/098987
DATED : June 15, 2010
INVENTOR(S) : Osamu Ichikawa It is certified that error appears in the above-identified patent and that said Letters Patent is hereby corrected as shown below:

Title Page, Item (30), Foreign Application Priority Data should read

"August 30, 2002 (JP)................................................2002-254181"

Signed and Sealed this

Twenty-sixth Day of October, 2010

David J. Kappos
*Director of the United States Patent and Trademark Office*